(12) United States Patent
Hiller

(10) Patent No.: US 8,771,570 B1
(45) Date of Patent: Jul. 8, 2014

(54) METHOD FOR PRODUCING QUANTUM DOTS

(75) Inventor: Nathan David Hiller, Fallbrook, CA (US)

(73) Assignee: Nanotron, Inc., Irvine, CA (US)

( * ) Notice: Subject to any disclaimer, the term of this patent is extended or adjusted under 35 U.S.C. 154(b) by 751 days.

(21) Appl. No.: 12/780,888

(22) Filed: May 15, 2010

Related U.S. Application Data

(63) Continuation-in-part of application No. 12/474,274, filed on May 29, 2009, now abandoned, and a continuation-in-part of application No. 12/611,080, filed on Nov. 2, 2009, now abandoned.

(51) Int. Cl.
*B29C 70/68* (2006.01)
*B29C 70/88* (2006.01)
*B29C 35/02* (2006.01)

(52) U.S. Cl.
USPC ............... 264/172.11; 264/235; 264/235.6; 264/346

(58) Field of Classification Search
None
See application file for complete search history.

(56) References Cited

U.S. PATENT DOCUMENTS

| | | | |
|---|---|---|---|
| 5,260,957 A * | 11/1993 | Hakimi et al. .............. | 372/39 |
| 6,194,237 B1 * | 2/2001 | Kim et al. .................. | 438/22 |
| 6,424,004 B2 * | 7/2002 | Kim et al. .................. | 257/321 |
| 7,295,734 B2 | 11/2007 | Bayindir | |
| 7,530,239 B2 | 5/2009 | Dutta | |
| 7,559,215 B2 | 7/2009 | Dutta | |
| 2005/0111805 A1 * | 5/2005 | Hertz et al. ................ | 385/125 |
| 2008/0087047 A1 | 4/2008 | Bayindir | |

OTHER PUBLICATIONS

Hicks, L. D., "Thermoelectric Figure of Merit of a One-Dimensional Conductor", Phys. Rev. B vol. 47, 16631, 1993.
Walkauskas, S. G., "Lattice thermal conductivity of wires", Journal of Applied Physics, vol. 85, No. 5, 2579, 1999.
Zhou, J., "Thermoelectric properties of individual electrodeposited bismuth telluride nanowires", Applied Physics Letters, 87, 133109, 2005.
Broido, D. A., "Thermoelectric figure of merit of quantum wire superlattices", Applied Physics Letters, 67 (1), 100, 1995.
Donald, I. W., "Production, properties and applications of microwire and related products", Journal of Materials Science, vol. 22, 2661-2679, 1987.
Van Krevelen, D. W., "Properties of polymers: their correlation with chemical structure; their numerical estimation and prediction . . . " Amsterdam, New York: Elsevier, 1990.
Bayindir, M., "Metal-insulator-semiconductor optoelectronic fibres", Nature, vol. 431, 826, 2004.

(Continued)

*Primary Examiner* — Edmund H. Lee

(57) ABSTRACT

One embodiment of a method for producing a plurality of nanostructures embedded in a host comprising the steps of: assembling a first preform, drawing said first preform into a first fiber, cutting said first fiber into a plurality of pieces, assembling said pieces of said first fiber into a second preform, and drawing said second preform into a second fiber. The host is made of a low thermal conductivity material such as a polymer or combination of polymers. The host can assume the form of a plurality of nanotubes which further reduces the host's thermal conductivity due to enhanced phonon scattering. The host can exhibit anisotropic thermal conductivity which reduces its thermal conductivity perpendicular to the direction in which it was drawn. The nanostructure-host composite can be cut into pieces and assembled into efficient thermoelectric devices for use in cooling or electric power generation applications. Other embodiments are described and shown.

15 Claims, 8 Drawing Sheets

(56) References Cited

OTHER PUBLICATIONS

Bayindir, M., "Kilometer-Long Ordered Nanophotonic Devices by Preform-to-Fiber Fabrication", IEEE J. of Sel. Top. in Quant. Elect., vol. 12. No. 6, 1202, 2006.

Washo, B. D., "Heat Conduction in Linear Amorphous High Polymers: Orientation Anisotropy," Journal of Applied Physics, vol. 40, No. 6, 2423, 1969.

Jin, J., "In-plane thermal conductivity of nanoscale polyaniline thin films", Applied Physics Letters, 95, 033113, 2009.

Humphrey, T.E., et. al., "Reversible Thermoelectric Nanomaterials", Physical Review Letters, PRL 94, 096601, 2005.

Van Der Vegt, A.K., "From Polymers to Plastics", Delft, The Netherlands, Delft University Press, p. 149, Fig. 8.5, 2002.

Mahan, G.D., et. al., "The best thermoelectric", Proc. Natl. Acad. Sci., vol. 93, 7436-7439, 1996.

Qin, Y., et. al., "General Assembly Method for Linear Metal Nanoparticle Chains Embedded in Nanotubes", Nano Letters, vol. 8, No. 10, 3221-3225, 2008.

Qin, Y., et. al., "Rayleigh-Instability-Induced Metal Nanoparticle Chains Encapsulated in Nanotubes Produced by Atomic Layer Deposition", Nano Letters, V.8, No. 1, 114-118, 2008.

Peng, H.Y., et. al., "Bulk-quantity Si nanosphere chains prepared from semi-infinite length Si nanowires", Journal of Applied Physics, vol. 89, No. 1, 727-731, 2001.

\* cited by examiner

US 8,771,570 B1

METHOD FOR PRODUCING QUANTUM DOTS

CROSS-REFERENCE TO RELATED APPLICATIONS

This application is a CIP of Ser. No. 12/474,274, filed 2009 May 29 by the present inventor, and a CIP of Ser. No. 12/611,080, filed 2009 Nov. 2 by the present inventor, which are incorporated by reference.

STATE SPONSORED RESEARCH

This invention was made with State of California support under California Energy Commission Grant number 56019A/08-11. The Energy Commission has certain rights to this invention.

FEDERALLY SPONSORED RESEARCH

Not Applicable

SEQUENCE LISTING OR PROGRAM

Not Applicable

BACKGROUND

1. Field

This application relates to methods for making thermoelectric materials, specifically to methods for producing nanowires or quantum dots embedded in a solid.

2. Prior Art

When a temperature difference is applied across a thermoelectric material, electrical charge diffuses to one of its ends. If the thermoelectric material is n-type then a net negative charge diffuses to its cold end. If the thermoelectric material is p-type then a net negative charge diffuses to its hot end. The magnitude of this net charge buildup on the thermoelectric material's ends is expressed by its Seebeck coefficient, S.

If an n-type and p-type thermoelectric materials are placed near each other and their hot ends are electrical connected and their cold ends are electrical connected, electric current will flow through the thermoelectric materials. This electric current can be harnessed to provide electric power.

If no temperature difference exists across electrically connected n-type and p-type thermoelectric materials, a temperature difference can be created by driving an electric current through them. Generally, up to a point, the higher the electric current, the greater the temperature difference created. This temperature difference can be used to cool an object.

Whether thermoelectric materials are used to generate electrical power or for cooling, some of the energy transfer involved is lost (i.e. unusable). In either case, a temperature difference exists across the thermoelectric materials so energy flows (heat) through them. This heat is lost. Heat loss through thermoelectric materials can be minimized by using thermoelectric materials with a low thermal conductivity, k. Furthermore, electric current flowing through the thermoelectric materials results in resistive power loss. This resistive power loss can be minimized by using thermoelectric materials with a high electrical conductivity, $\sigma$.

So qualitatively, it is understandable that S and $\sigma$ should be high and k should be low for efficient power generation and cooling. Through a rigorous mathematical derivation it can be shown that the efficiency of a thermoelectric material is directly related to a dimensionless figure of merit, ZT, which is defined as: $ZT=TS^2\sigma/k$, where T is temperature.

Thermoelectric devices have been limited to niche markets due to their low energy efficiency and high cost. ZT for commercial thermoelectric materials is close to 1 at room temperature; however a $ZT \geq 2$ is needed to compete with the energy efficiencies of most conventional cooling machines (i.e. automobile air-conditioners, small household refrigerators, etc.). Commercial thermoelectric devices are expensive because one of their primary constituents, tellurium, is a relatively rare and expensive element that is in high demand due to the rapid growth in cadmium telluride solar cell production. Given the continued global support for clean energy technologies (i.e. CdTe solar cells), there is an urgent economic need to replace tellurium based thermoelectric materials with a less expensive material that exhibits a $ZT \geq 1$.

The most promising approach for increasing ZT of a material is to make it into a nanostructured form. In 1993, Hicks and Dresselhaus ("Thermoelectric Figure of Merit of a One-Dimensional Conductor", Physical Review B Vol. 47, pp. 16631, 1993) pointed out that, due to the quantum-mechanical nature of the motion of electrons through solids, confining such electrons in a structure with a physical dimension below the spatial extent of the electron wave function should result in a much increased S and $\sigma$, thus strongly increasing ZT (later it was found that nanostructures also reduce k due to phonon scattering). For example a figure of merit ZT=6 (at 77° K) is predicted for 5 nm diameter bismuth nanowires oriented parallel to a temperature gradient. Humphrey et. al. ("Reversible Thermoelectric Nanomaterials", Physical Review Letters, PRL 94, 096601, 2005) calculated ZT=10 (at 300° K) for nanowires oriented perpendicular to a temperature gradient.

After Hicks and Dresselhaus published their work in 1993, many attempts were made to fabricate thermoelectric nanostructures using a variety of methods. The results were disappointing primarily because of the costly and slow fabrication methods used and by the fact that bulk quantities of thermoelectric nanostructures must be embedded in a solid for structural support. This solid or host material is usually not a thermoelectric material so it tends to leak electric current and heat which significantly reduces ZT of the nanostructure-host composite. Generally the electrical current leakage is not a problem because thermoelectric nanostructures are made of a semiconductor so the host material can be made of an electrical insulator (i.e. thermoelectric material is $Bi_2Te_3$: $\sigma\sim1\times10^5$ $(\Omega\cdot m)^{-1}$, host material is glass: $\sigma\sim1\times10^{-12}$ $(\Omega\cdot m)^{-1}$). However, the heat leakage is a problem because good thermoelectric materials tend to be thermal insulators (i.e. $Bi_2Te_3$: $k\sim1.2$ W/(m·K), glass: $k\sim1$ W/(m·K)). This heat leakage (or heat loss) becomes more significant by the fact that the thermal conductivity of nanostructures decreases dramatically as their size decreases: see for example FIG. 1 in Walkauskas et. al ("Lattice thermal conductivity of wires", Journal of Applied Physics, Vol. 85, No. 5, 2579, 1999) and Zhou et. al. ("Thermoelectric properties of individual electrodeposited bismuth telluride nanowires", Applied Physics Letters, 87, 133109, 2005). Increasing the number of thermoelectric nanostructures in a given volume of the host material helps to reduce this heat leak, however if the thermoelectric nanostructures are too close to one another, electron tunneling between adjacent thermoelectric nanostructures reduces ZT of the nanostructure-host composite as calculated by Broido and Reinecke (see FIG. 1 in "Thermoelectric figure of merit of quantum wire superlattices", Applied. Physics Letters, 67 (1), 100, 1995). Clearly there is a need to use very low thermal conductivity materials to host thermoelectric nanostructures.

Making wires, with diameters less than 1 urn, embedded in glass, can be produced with the Taylor-wire process (see Section 2.2.1 and FIG. 1 in I. W. Donald "Production, properties and applications of microwire and related products," Journal of Materials Science, Vol. 22, 2661-2679, 1987). Donald describes the Taylor-wire process as follows: "... the metal to be drawn was contained in a glass tube ~2 mm internal diameter, which was closed at one end. This end of the tube was heated in a gas flame until the metal melted and the glass softened, when the tube was drawn down, by hand, to produce metal-filled rods ~0.5 to 1.0 mm diameter by about 300 mm long. Subsequently, these rods were re-drawn to the diameter required ...". In 2005, Dutta (U.S. Pat. No. 7,559,215) used the Taylor-wire process in his attempt to make wire with the "diameter required" for high ZT thermoelectric materials.

The problem with the wires that Dutta produced is that the host material, in which Dutta's wires were embedded, was a glass. In fact, as stated in all Dutta's independent claims, glass is the material used to host his wires. Although glass is generally an electrical insulator, a much better thermal insulator is needed to host low thermal conductivity thermoelectric wires. For example, polymers have thermal conductivities that are typically ¼ to ½0 that of glasses (see FIG. 17.5 on page 652 in "Properties of polymers: their correlation with chemical structure; their numerical estimation and prediction from additive group contributions" e.d. D.W. Van Krevelen, Amsterdam, New York: Elsevier, 1990, and FIG. 8.5 on page 149 in "From Polymers to Plastics", A. K. van der Vegt, Delft, The Netherlands, Delft University Press, 2002). Dutta did not realize the large heat leak through the glass that hosted his wires, which, in turn, lead to his erroneous calculations of ZT that he states in his U.S. Pat. No. 7,559,215.

In research not related to thermoelectric materials, Bayindir et. al. (see inset of FIG. 1a in "Metal-insulator-semiconductor optoelectronic fibres," Nature, Vol. 431, 826, 2004, and U.S. Pat. No. 7,295,734 filed in 2004) developed a method for making optoelectronic fibers that included microwires embedded in a polymer or glass, by using a conventional optical fiber drawing process. A couple of years later Bayindir (see FIG. 3d in "Kilometer-Long Ordered Nanophotonic Devices by Preform-to-Fiber Fabrication," IEEE Journal of Selected Topics in Quantum Electronics, Vol. 12. no. 6, 1202, 2006, also see US Patent Application No. 2008/0087047) refined his method further by making photonic bandgap optical fibers containing 200 nm diameter nanowires embedded in a polymer. Bayindir's fibers were designed to function as photonic or optoelectronic devices which are very different from thermoelectric devices.

For making nanowires, Bayinder's method has two advantages over Dutta's use of the Taylor-wire process. First, Bayinder's method is compatible with polymer hosts which typically have much lower thermal conductivities than that of glasses. Although drawing a polymer tends to increase its thermal conductivity parallel to the draw direction, and decrease its thermal conductivity perpendicular to the draw direction, this thermal conductivity anisotropy can be significantly reduced by drawing the fiber at higher temperatures as demonstrated by Washo et. al. (see FIG. 2 in "Heat Conduction in Linear Amorphous High Polymers: Orientation Anisotropy," Journal of Applied Physics, Vol. 40, no. 6, 2423, 1969"). Second, in Bayinder's method the nanowire host can be heterogeneous, such as assuming the form of nanotubes which further reduces the host's thermal conductivity due to phonon scattering at the nanotubes' inner and outer surfaces, i.e. the tube wall is like a thin polymer film that scatters phonons as measured by Jin et. al. (see Table I in "In-plane thermal conductivity of nanoscale polyaniline thin films", Applied Physics Letters, 95, 033113, 2009).

So the method that Bayindir uses to make nanowires for optoelectronic and photonic devices in fibers could have a new use, namely, using nanowires embedded in a polymer or combination of polymers to serve as high ZT thermoelectric materials.

Furthermore, by pushing Bayindir's method of making nanowires beyond its intended operating parameters, the nanowires can be made to uniformly breakup into a well ordered, three dimensional array of quantum dots, which is the theoretically best (i.e. highest ZT) thermoelectric nanostructure. For ZT calculations on quantum dots see Mahan et. al. ("The best thermoelectric", Proc. Natl. Acad. Sci., Vol. 93, 7436-7439, 1996) and Humphrey et. al. ("Reversible Thermoelectric Nanomaterials", Physical Review Letters, PRL 94, 096601, 2005).

Furthermore, as previously noted, drawn polymers exhibit anisotropy in their thermal conductivity so if a fiber containing quantum dots is oriented such that the direction in which it was drawn is perpendicular to the applied temperature gradient, the fiber's ZT will be further increased because the fiber's thermal conductivity is lowest in this orientation.

Although several researches have successfully made nanoparticle chains in nanotubes and nanowires, the methods they employed are not suitable for producing bulk quantities of nanostructured thermoelectric materials. For example Qin et. al. ("General Assembly Method for Linear Metal Nanoparticle Chains Embedded in Nanotubes", Nano Letters, Vol. 8, No. 10, 3221-3225, 2008, and "Rayleigh-Instability-Induced Metal Nanoparticle Chains Encapsulated in Nanotubes Produced by Atomic Layer Deposition", Nano Letters, Vol. 8, No. 1, 114-118, 2008) used a slow atomic layer deposition process to make nanoparticles in nearly parallel, but short, and irregularly spaced nanotubes. Peng et. al. ("Bulk-quantity Si nanosphere chains prepared from semi-infinite length Si nanowires", Journal of Applied Physics, Vol. 89, No. 1, 727-731, 2001) slowly grew short, randomly oriented nanowires containing nanospheres.

The problems with the methods Qin and Peng use to make nanoparticle chains is: 1) they use slow atomic layer deposition or growth methods, 2) the spacing between their nanoparticle chains is not well controlled which is important for achieving a high ZT thermoelectric material because if this spacing is too large then too much heat is leaked and if this spacing is too small then electron tunneling occurs, and 3) only short lengths and small quantities of nanoparticles can be produced.

So pushing Bayindir's method of making nanowires beyond its intended operating parameters, quantum dots embedded in a polymer or combination of polymers can be made to serve as high ZT thermoelectric materials.

SUMMARY

In accordance with one embodiment a method for producing nanostructures embedded in a host comprising the steps of assembling a preform and drawing the preform into a fiber. The fiber comprising nanostructures embedded in a host described herein is referred to as the nanostructure-host composite or thermoelectric fiber and it exhibits a ZT value higher than the ZT value for the same materials in bulk form. The thermoelectric fiber can be cut into pieces and assembled into thermoelectric devices for use in cooling or electric power generation.

DRAWINGS

Figures

DRAWINGS

Reference Numerals

| 10 | two draw production sequence | 11 | three draw production sequence |
| --- | --- | --- | --- |
| 12 | first production step | 14 | optional second production step |
| 16 | third production step | 18 | fourth production step |
| 20 | optional fifth production step | 22 | sixth production step |
| 23 | optional anneal second fiber step | 24 | seventh production step |
| 26 | optional eighth production step | 28 | ninth production step |
| 30 | optional anneal third fiber step | 40 | macroscopic assembly |
| 42 | preform | 44 | fiber |
| 46 | first preform | 48 | cylinder with cylindrical hole |
| 50 | rod | 52 | first preform |
| 54 | cylinder with cylindrical holes | 56 | rod array |
| 60 | first preform | 62 | cylinder with cylindrical hole |
| 64 | cylinder with cylindrical hole | 66 | cylinder with cylindrical hole |
| 68 | support | 70 | air gap |
| 72 | first preform | 74 | support |
| 80 | preform | 82 | fiber bundle |
| 84 | support | 90 | thermoelectric fiber |
| 92 | nanostructures | 94 | host |
| 96 | thermoelectric fiber | 98 | nanotubes |
| 100 | encapsulated nanowire | 102 | host |
| 104 | nanowire | 108 | void |
| 110 | encapsulated quantum dots | 112 | quantum dots |

DETAILED DESCRIPTION

FIGS. 1-8

Figure 1A:
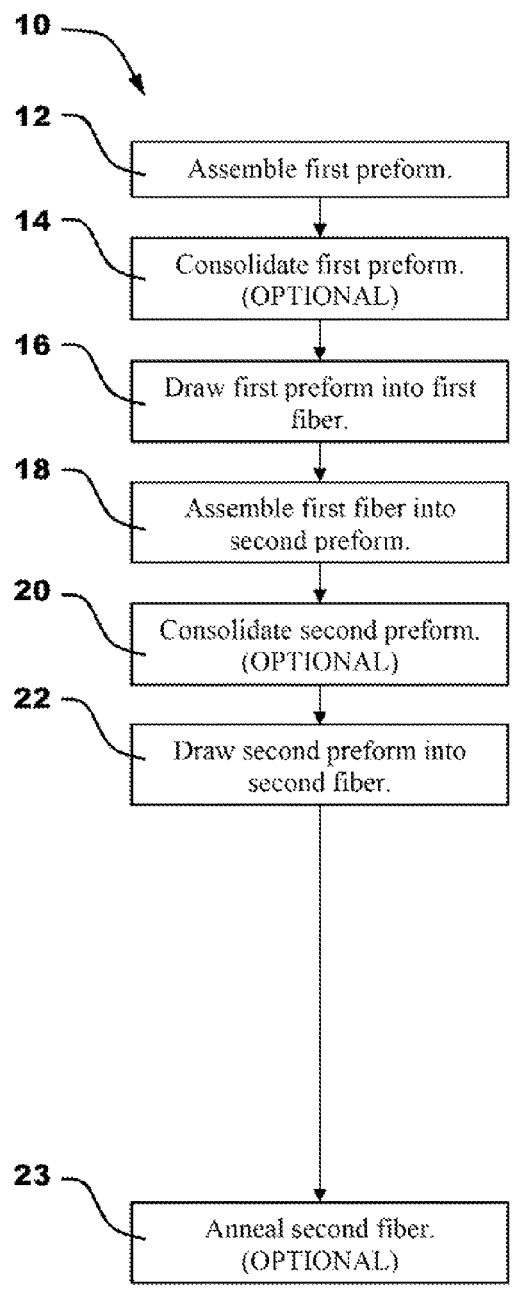
FIGS. 1A and 1B are flow charts of processing steps of preform assemblies, draw processes, and fiber annealing in accordance with one embodiment.
Figure 1B:
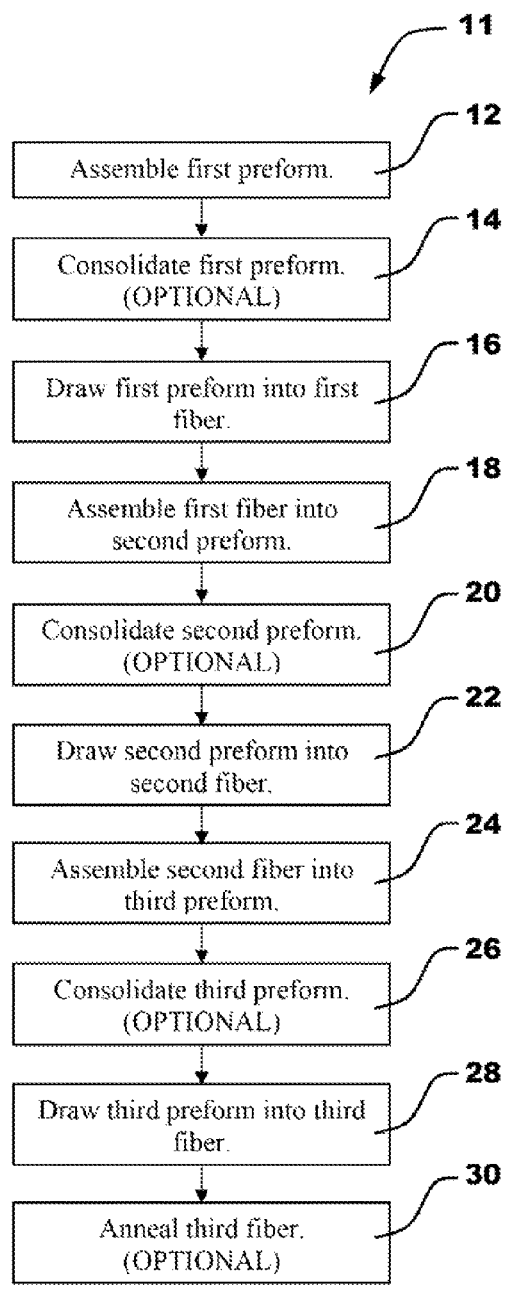

FIGS. 1A and 1B are flow charts of processing steps of preform assemblies, draw processes, and fiber annealing in accordance with one embodiment. Fibers or thermoelectric fibers produced in accordance with this embodiment are three-dimensional, unsupported physical objects for which one dimension, defined as the longitudinal dimension, is substantially larger than the other two dimensions, defined as the cross-sectional dimensions, and are fabricated by, e.g., a two draw production sequence 10 or a three draw production sequence 11 outlined in the flow charts of FIGS. 1A and 1B, respectively. The optimal production sequence selected depends on many factors such as preform assembly cost, fiber drawing tower capabilities, drawing fiber cost, and desired materials and dimensions of the nanostructures and host in a thermoelectric fiber.

For the two draw production sequence, a first production step 12 consists of assembling a first preform. The first preform includes various materials, arranged in a macroscopic geometric configuration corresponding to, though not necessarily equivalent to, the desired geometry of a first fiber. The first preform is characterized by a ratio of longitudinal to cross-sectional dimensions that is typically between about 2 and about 100.

Once the first preform is assembled, an optional second production step 14 can be implemented by sealing the ends of the first preform followed by consolidation. The consolidation process, executed under selected temperature and pressure conditions, is employed to eliminate gaps and to ensure element shape integrity throughout the draw process. Sealing the ends of the first preform is used to confine material that can come out of the ends of the first preform, e.g. melted material.

In a third production step 16 the first preform is drawn into extended lengths of the first fiber using a conventional fiber drawing tower. The first fiber preserves the cross-sectional geometric configuration of the first preform while reducing the first preform's feature sizes to smaller scales.

In a fourth production step 18, a second preform is assembled. The second preform includes pieces of the first fiber and other materials arranged in a macroscopic geometric configuration corresponding to, though not necessarily equivalent to, the desired geometry of a second fiber or a thermoelectric fiber. The second preform is characterized by a ratio of longitudinal to cross-sectional dimensions that is typically between about 2 and about 100.

Once the second preform is assembled, an optional fifth production step 20 can be implemented by consolidating the second preform.

In a sixth production step 22, the second preform is drawn into extended lengths of the second fiber or thermoelectric fiber using a conventional fiber drawing tower. The second fiber or thermoelectric fiber preserves the cross-sectional geometric configuration of the second preform while reducing the second preform's feature sizes to smaller scales.

Once the second fiber is drawn, an optional anneal second fiber step 23 can be implemented. The optional anneal second fiber step, carried out under selected temperature and pressure conditions, is employed to transform the shape of the nanostructures and/or enlarge and reduce the number of crystals that make up the nanostructures in the second fiber or thermoelectric fiber.

For the three draw production sequence 11 in FIG. 1B, the production steps 12, 16, 18, 22 and optional steps 14 and 20 of the two draw production sequence are repeated.

In a seventh production step 24, a third preform is assembled. The third preform includes pieces of the second fiber and other materials arranged in a macroscopic geometric configuration corresponding to, though not necessarily equivalent to, the desired geometry of a third fiber or a thermoelectric fiber. The third preform is characterized by a ratio of longitudinal to cross-sectional dimensions that is typically between about 2 and about 100.

Once the third preform is assembled, an optional eighth production step 26 can be implemented by consolidating the third preform.

In a ninth production step 28, the third preform is drawn into extended lengths of the third fiber or thermoelectric fiber using a conventional fiber drawing tower. The third fiber or thermoelectric fiber preserves the cross-sectional geometric configuration of the third preform while reducing the third preform's feature sizes to smaller scales.

Once the third fiber is drawn, an optional anneal third fiber step 30 can be implemented. The optional anneal third fiber step, carried out under selected temperature and pressure conditions, is employed to transform the shape of the nanostructures and/or enlarge and reduce the number of crystals that make up the nanostructures in the third fiber or thermoelectric fiber.

Figure 2:
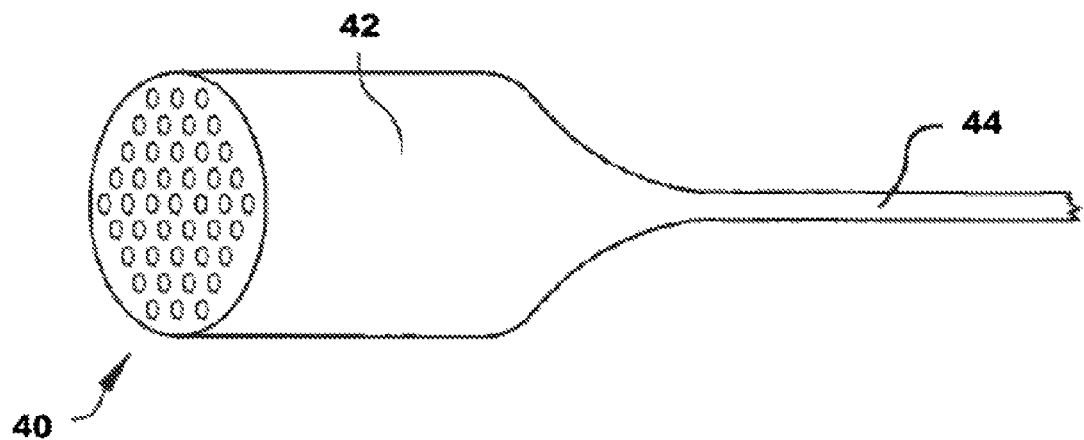
FIG. 2 is a schematic representation of a preform and a corresponding fiber produced by drawing the preform in accordance with another embodiment.

These striking dimensional shifts produced by the fiber drawing process are schematically illustrated in FIG. 2. A macroscopic assembly 40 of various materials are arranged as a preform 42 having a diameter on the order of about 10 mm to about 150 mm and a length on the order of centimeters. The preform is then subjected to heating and deformation using a conventional fiber drawing tower to produce a fiber 44.

Fiber 44 has a length up to many kilometers, and a diameter on the order of between about 30 µm and about 2000 µm. Within the fiber, feature sizes on the order of a few nanometers can be produced. The embodiment of the fiber drawing method thereby preserves the preform's element organization along its length while reducing element sizes to the micro- and nano-scale along extended fiber lengths.

Figure 3A:
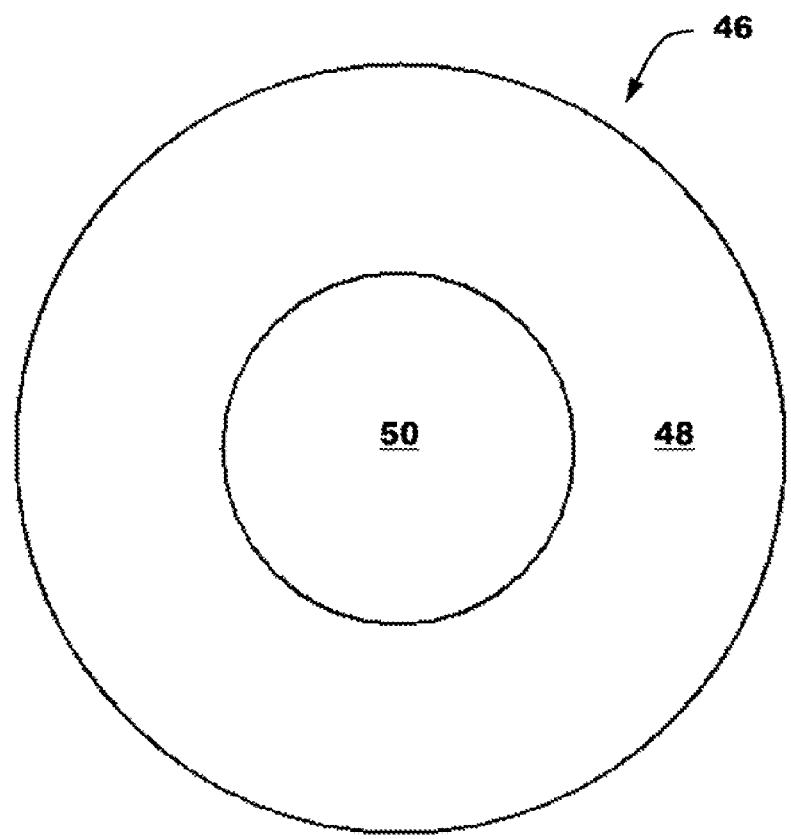
FIGS. 3A-3D are schematic cross-sectional views of example first preform assemblies in accordance with another embodiment.

FIG. 3A is a schematic cross-sectional view of an example of a first preform 46 that can be used as the first preform in the two draw production sequence 10 or the first preform in the three draw production sequence 11 shown in FIGS. 1A and 1B, respectively. The first preform 46 is assembled from a cylinder with cylindrical hole 48 and a rod 50. The cylinder with cylindrical hole 48 can be made of any material that can be drawn into fiber, e.g. polymer or glass. The rod 50 can be made of any material that has a melting temperature below the temperature at which the first preform 46 is drawn into fiber.

Figure 3B:
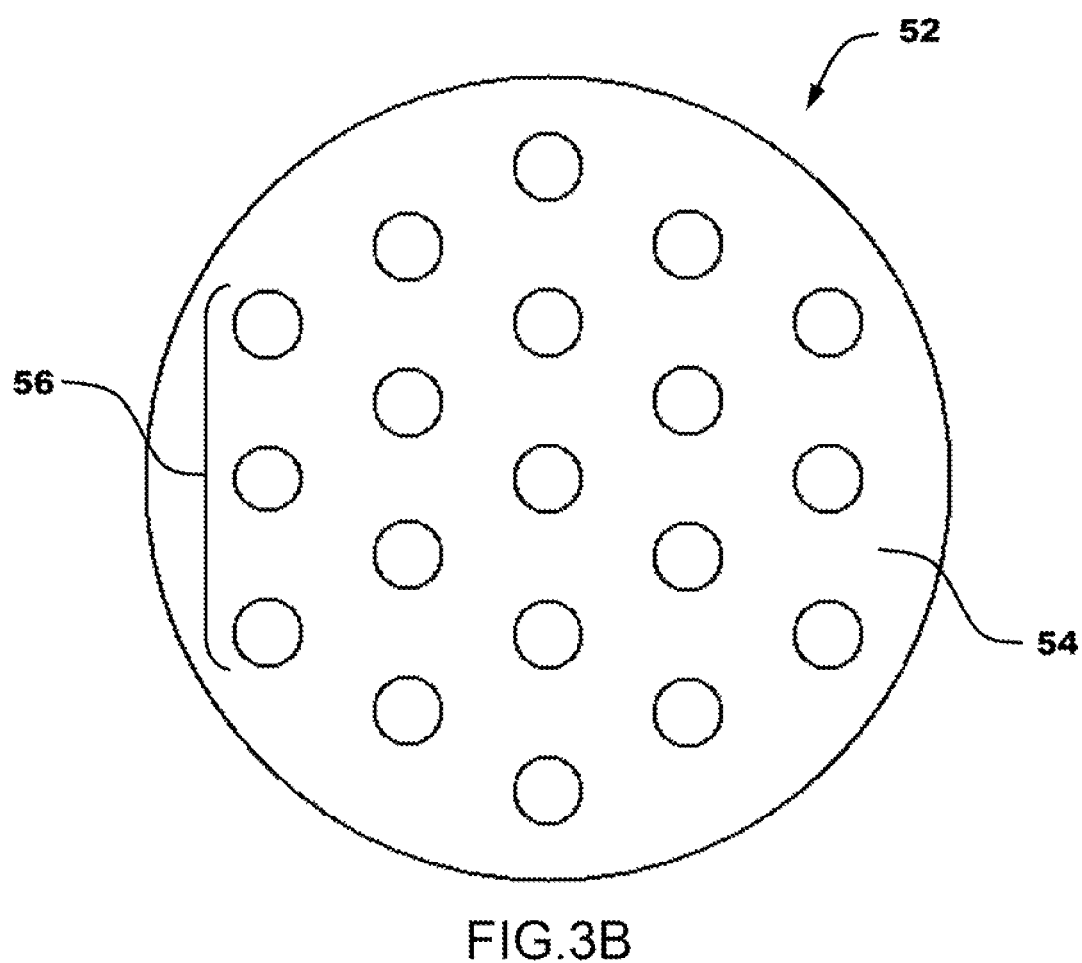

FIG. 3B is a schematic cross-sectional view of an example of a first preform 52 that can be used as the first preform in the two draw production sequence 10 or the first preform in the three draw production sequence 11 shown in FIGS. 1A and 1B, respectively. The first preform 52 is assembled from a cylinder with cylindrical holes 54 and a rod array 56. The cylinder with cylindrical holes 54 can be made of any material that can be drawn into fiber, e.g. polymer or glass. The rod array 56 can be made of any material that has a melting temperature below the temperature at which the first preform 52 is drawn into fiber.

Figure 3C:
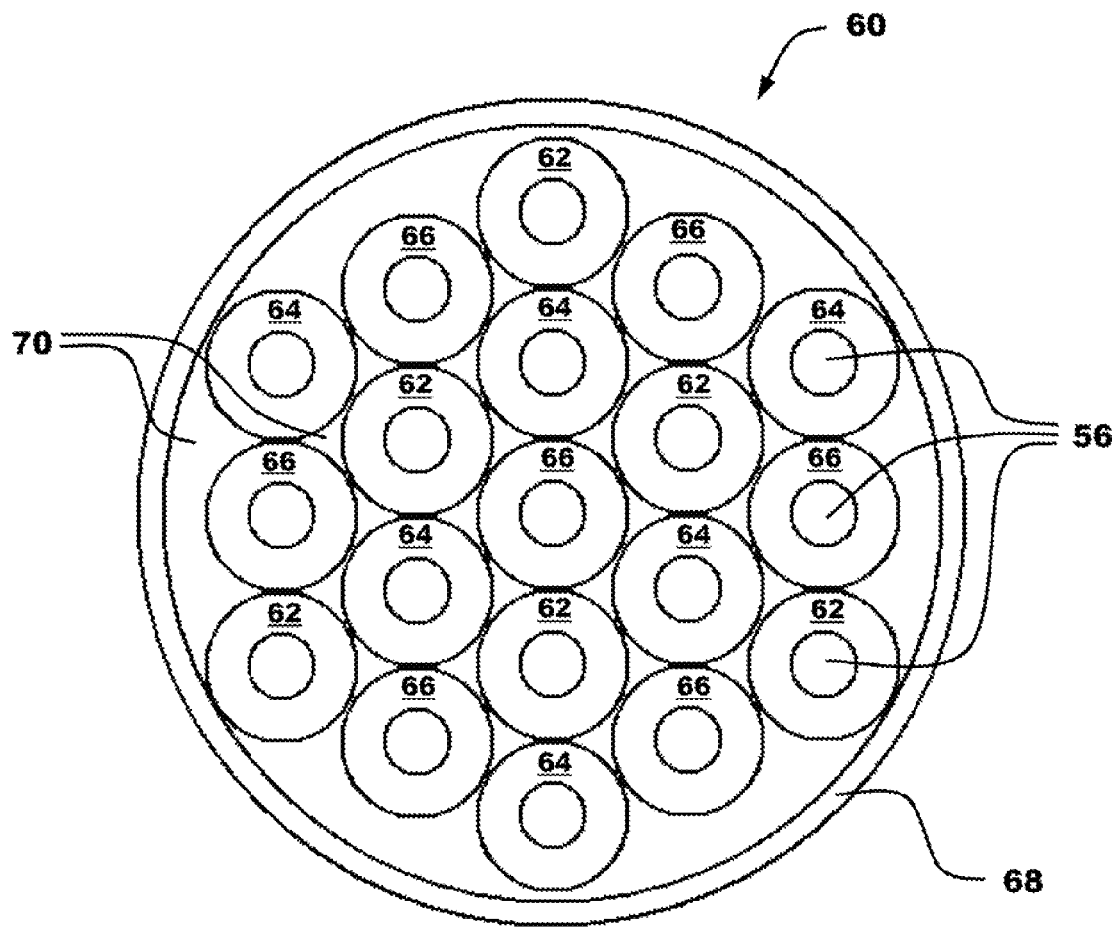

FIG. 3C is a schematic cross-sectional view of an example of a first preform 60 that can be used as the first preform in the two draw production sequence 10 or the first preform in the three draw production sequence 11 shown in FIGS. 1A and 1B, respectively. A cylinder with cylindrical hole 62, a cylinder with cylindrical hole 64, and a cylinder with cylindrical hole 66 are arranged such that same cylinders do not contact one another. For example; cylinder 62 only contacts cylinder 64 and cylinder 66; cylinder 64 only contacts cylinder 62 and cylinder 66; and cylinder 66 only contacts cylinder 62 and cylinder 64. Both cylinder 62 and the cylinder 64 occupy six positions in the first preform 60. The cylinder 66 occupies seven positions in the first preform 60. The cylinder 62, the cylinder 64, and the cylinder 66 are held together by a support 68 and an air gap 70 exists in the first preform 60. The support 68 is a cylindrical tube structure. The support 68, the cylinder 62, the cylinder 64, and the cylinder 66 can made of different materials but each material must be able to be drawn into fiber, e.g. polymer or glass, at the same temperature. The rod array 56 can be made of any material that has a melting temperature below the temperature at which the first preform 60 is drawn into fiber.

Figure 3D:
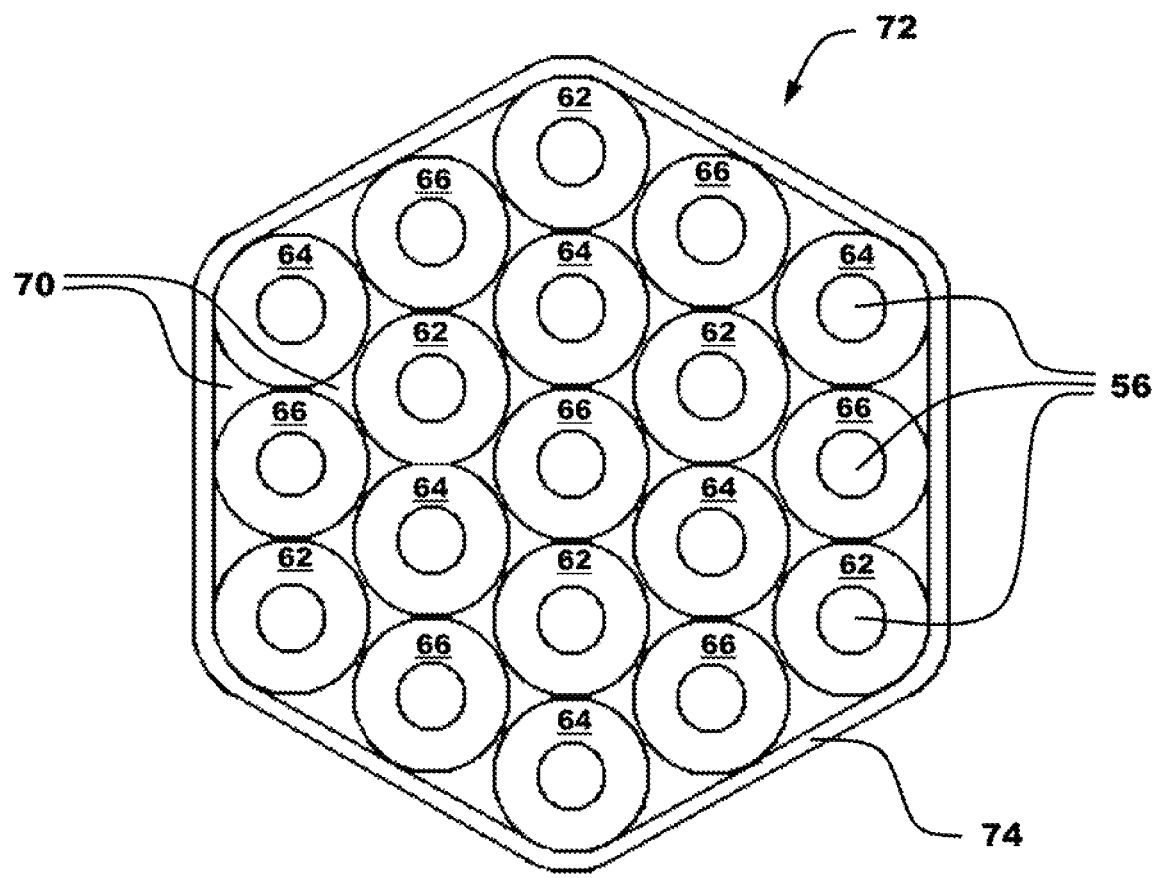

FIG. 3D is a schematic cross-sectional view of an example of a first preform 72 that can be used as the first preform in the two draw production sequence 10 or the first preform in the three draw production sequence 11 shown in FIGS. 1A and 1B, respectively. The first preform 72 is the same as the first preform 60 except the support 68 is replaced with a support 74 which is a flexible sheet wrap. The support 74, the cylinder 62, the cylinder 64, and the cylinder 66 can made of different materials but each material must be able to be drawn into fiber, e.g. polymer or glass, at the same temperature. The rod array 56 can be made of any material that has a melting temperature below the temperature at which the first preform 72 is drawn into fiber.

Figure 4:
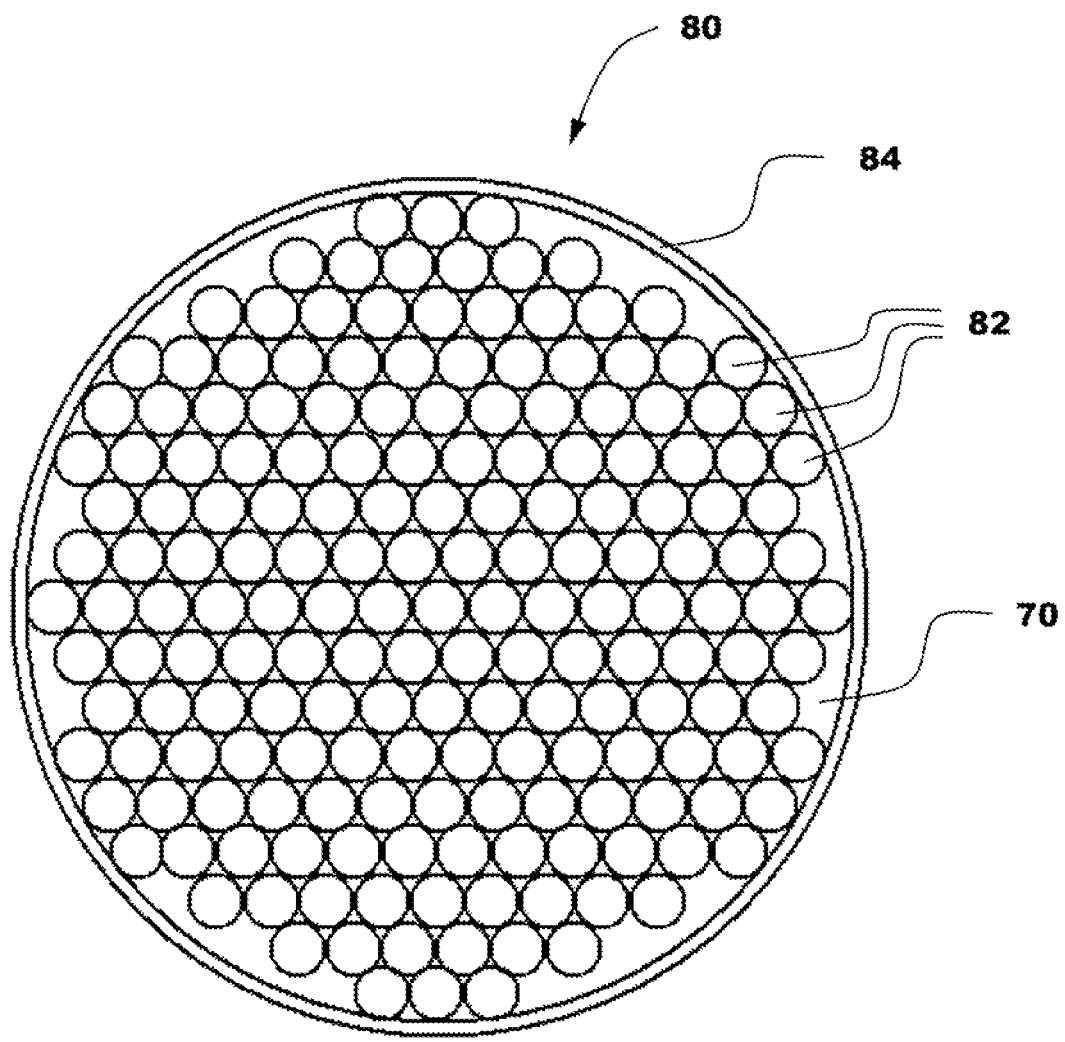
FIG. 4 is a schematic cross-sectional view of an example second or third preform assembly in accordance with another embodiment.

FIG. 4 is a schematic cross-sectional view of an example of a preform 80 that can be used as the second preform in the two draw production sequence 10 of FIG. 1A or the second and/or the third preform in the three draw production sequence 11 of FIG. 1B. The preform 80 is assembled from a fiber bundle 82 bound together by a support 84. The air gap 70 exists within the preform 80. The fiber bundle 82 is assembled from many pieces of first fiber for the second preform or from many pieces of second fiber for the third preform. The support 84 can be a cylindrical tube structure or a flexible wrap and be a material that can be drawn into fiber at the same temperature as the temperature used to draw the fibers used to assemble the fiber bundle 82.

Figure 5A:
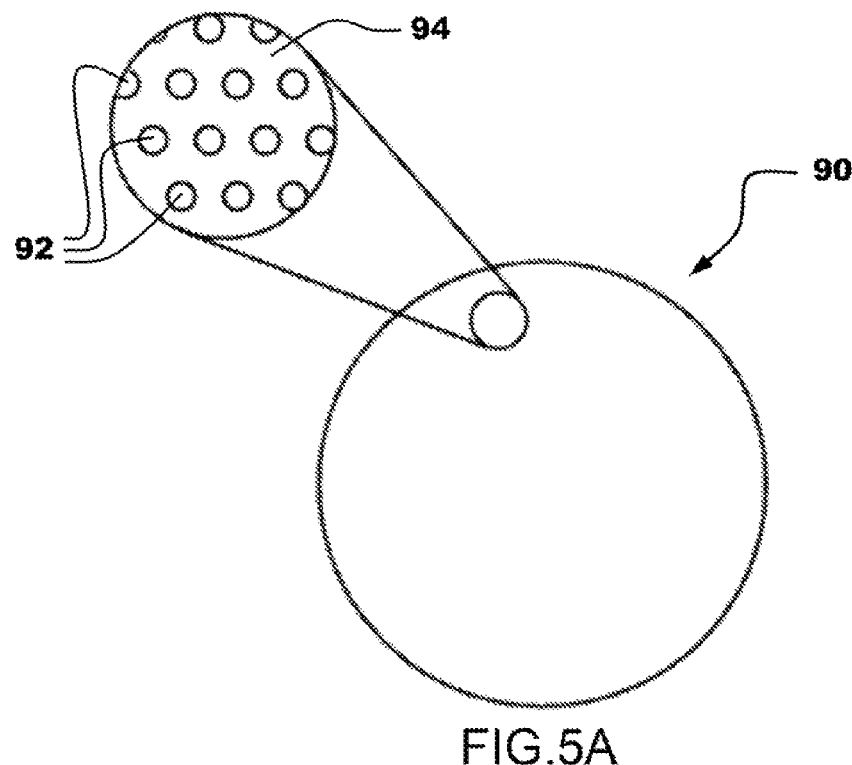
FIGS. 5A and 5B are schematic cross-sectional views of example nanostructure-host composites or thermoelectric fibers drawn in accordance with another embodiment.

FIG. 5A is a schematic cross-sectional view of an example of a thermoelectric fiber 90 produced using the two draw production sequence 10 or the three draw production sequence 11 illustrated in FIGS. 1A and 1B, respectively. If implementing sequence 10, the second fiber is the thermoelectric fiber 90. If implementing sequence 11, the third fiber is the thermoelectric fiber 90. The thermoelectric fiber 90 is a plurality of nanostructures 92 embedded in a host 94 that is homogeneous.

In FIG. 5A, the nanostructures 92 are made of a material that is the same as the rod 50 material if the first preform 46, as illustrated in FIG. 3A, is implemented in sequence 10, as illustrated in FIG. 1A, or sequence 11 as illustrated in FIG. 1B. The nanostructures 92 are made of a material that is the same as the rod array 56 material if the first preform 52, as illustrated in FIG. 3B, or the first preform 60, as illustrated in FIG. 3C, or the first preform 72, as illustrated in FIG. 3D, is implemented in sequence 10, as illustrated in FIG. 1A, or sequence 11 as illustrated in FIG. 1B.

In FIG. 5A, the host 94 material is made of the same material as the cylinder with cylindrical hole 48 material if the first preform 46, as illustrated in FIG. 3A, is implemented in sequence 10, as illustrated in FIG. 1A, or sequence 11 as illustrated in FIG. 1B.

In FIG. 5A, the host 94 material is made of the same material as the cylinder with cylindrical holes 54 material if the first preform 52, as illustrated in FIG. 3B, is implemented in sequence 10, as illustrated in FIG. 1A, or sequence 11 as illustrated in FIG. 1B.

In FIG. 5A, the host 94 material is made of the same material as the support 68 material, cylinder 62 material, cylinder 64 material, and cylinder 66 material if the first preform 60, illustrated in FIG. 3C, is implemented in sequence 10, as illustrated in FIG. 1A, or sequence 11 as illustrated in FIG. 1B. The host 94 material is homogeneous because in this case the support 68, cylinder 62, cylinder 64, and cylinder 66 are made of the same material.

In FIG. 5A, the host 94 material is made of the same material as the support 74 material, cylinder 62 material, cylinder 64 material, and cylinder 66 material if the first preform 72, illustrated in FIG. 3D, is implemented in sequence 10, as illustrated in FIG. 1A, or sequence 11 as illustrated in FIG. 1B. The host 94 material is homogeneous because in this case support 74, cylinder 62, cylinder 64, and cylinder 66, are made of the same material.

Figure 5B:
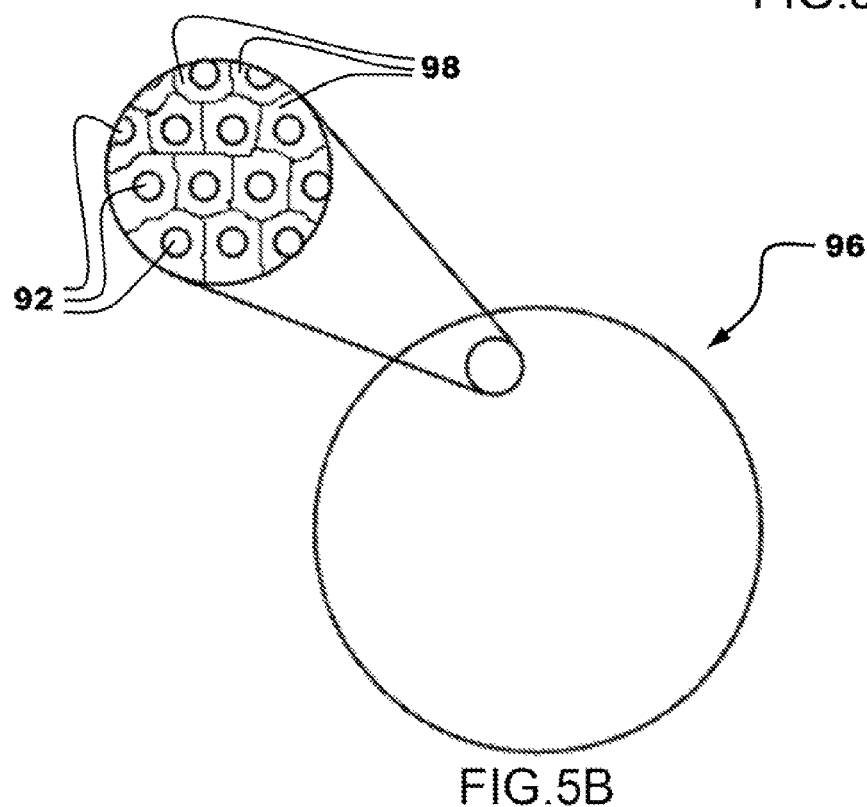

FIG. 5B is a schematic cross-sectional view of an example of a thermoelectric, fiber 96 produced using the two draw production sequence 10 or the three draw production sequence 11 illustrated in FIGS. 1A and 1B, respectively. If implementing sequence 10, the second fiber is the thermoelectric fiber 96. If implementing sequence 11, the third fiber is the thermoelectric fiber 96. The thermoelectric fiber 96 is the nanostructures 92 embedded in a plurality of nanotubes 98. The nanotubes 98 serve to host the nanostructures 92. The nanotubes 98 have an irregular outer surface and round inner surface.

In FIG. 5B, the nanostructures 92 are made of a material that is the same as the rod array 56 material if the first preform 60, as illustrated in FIG. 3C, or the first preform 72, as illustrated in FIG. 3D, is implemented in sequence 10, as illustrated in FIG. 1A, or sequence 11 as illustrated in FIG. 1B.

In FIG. 5B, any two nanotubes in contact with each other are each made of different materials. Each nanotube material is either the cylinder 62 material, cylinder 64 material, or cylinder 66 material if the first preform 60 or first preform 72, illustrated in FIG. 3C and FIG. 3D, respectively, is implemented in sequence 10, as illustrated in FIG. 1A, or sequence 11 as illustrated in FIG. 1B. If implementing the first preform 60 or first preform 72 to produce the nanotubes 98, then the cylinder 62, cylinder 64, and cylinder 66 cannot all be made of the same material.

Making the thermoelectric fiber 96 with the nanotubes 98 as the host, increases ZT of the thermoelectric fiber 96 because some phonon scattering occurs at the nanotubes 98 inner and outer surfaces, resulting in a decrease in thermal conductivity of the host. Nanotubes 98 can be produced by implementing the first preform 60 or the first preform 72 such that cylinder 62, cylinder 64, and cylinder 66, are all made from different materials, and implementing sequence 10, as illustrated in FIG. 1A, or sequence 11 as illustrated in FIG. 1B. The resultant thermoelectric fiber 96 will have a host that takes the form of the nanotubes 98 that will enhance phonon scattering. Although only one out of the three cylinders, cylinder 62, cylinder 64, and cylinder 66, need to be made of a different material to enhance phonon scattering, making all three cylinders out of different materials is preferred because of the additional phonon scattering achieved.

Figure 6:
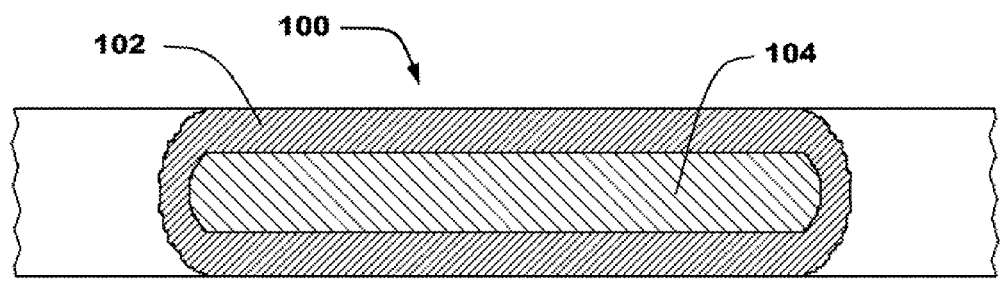
FIG. 6 is a schematic cutaway side view of a nanowire encapsulated by a host.

FIG. 6 is a schematic cutaway side view of an encapsulated nanowire 100. The encapsulated nanowire 100 is a nanowire 104 that is encapsulated by a host 102. The host 102 is either the host 94, as illustrated in FIG. 5A, or one of the nanotubes 98, as illustrated in FIG. 5B. By selecting a particular fiber drawing condition to draw the preform 80, as illustrated in FIG. 4, each of the nanostructures 92, illustrated in FIG. 5A or FIG. 5B, will be the nanowire 104 after the fiber drawing process is complete. However, by selecting another particular fiber drawing condition to draw the preform 80, each of the nanostructures 92 will be the nanowire 104 only up to a particular point in time during the fiber drawing process.

Figure 7A:
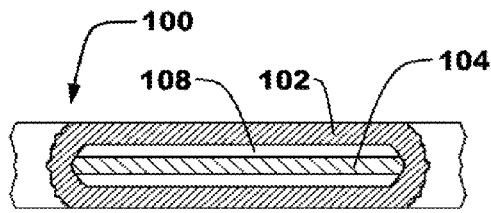
FIGS. 7A-7C are schematic cutaway side views of an encapsulated nanowire transforming into encapsulated quantum dots and voids.
Figure 7B:
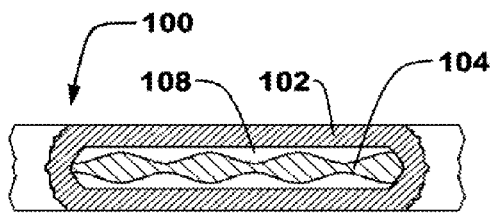
Figure 7C:
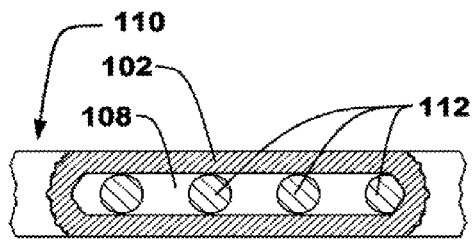

FIGS. 7A-7C are schematic cutaway side views of the encapsulated nanowire 100 transforming into a encapsulated quantum dots 110 with a void 108. By selecting a particular fiber drawing condition to draw the preform 80, as illustrated in FIG. 4, the void 108 forms during the fiber drawing process as illustrated in FIG. 7A (note that void formation "i.e. hole expansion" in preforms during fiber drawing is a fluid dynamics effect that is well known among researchers who draw microstructured fiber). During or after formation of the void 108 and as the drawing process continues, the nanowire 104 shape becomes undulated due to an instability (i.e. Rayleigh instability) as illustrated in FIG. 7B. As the drawing process continues further, the nanowire 104, illustrated in FIG. 7B, transforms into a quantum dots 112 as illustrated in FIG. 7C. So using a particular fiber drawing condition, the nanostructures 92 illustrated in FIG. 5A or FIG. 5B, will be the nanowire 104 during a portion of the fiber drawing process and the quantum dots 112 after the fiber drawing process is complete.

Figure 8A:
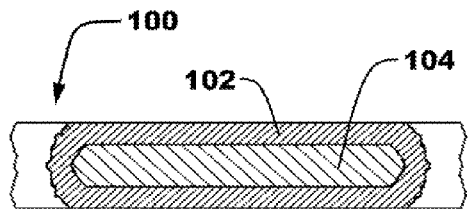
FIGS. 8A-8C are schematic cutaway side views of an encapsulated nanowire transforming into encapsulated quantum dots.
Figure 8B:
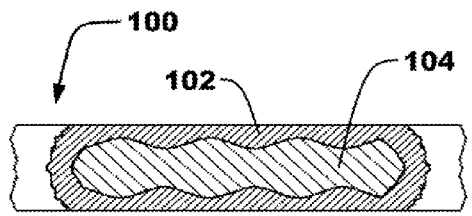
Figure 8C:
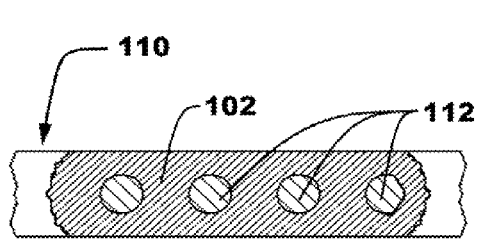

FIGS. 8A-8C are schematic cutaway side views of the encapsulated nanowire 100 transforming into the encapsulated quantum dots 110. By selecting a particular fiber drawing condition to draw the preform 80, as illustrated in FIG. 4, the void 108, as illustrated in FIGS. 7A-7C, will not form during the fiber drawing process as illustrated in FIG. 8A. If the fiber drawing condition is appropriate, the cylindrical shape of the host 102 will become unstable (i.e. Rayleigh instability), which will cause the cylindrical shapes of the host 102 and the nanowire 104 to undulate as illustrated in FIG. 8B. As the drawing process continues further, the nanowire 104, illustrated in FIG. 8B, transforms into the quantum dots 112 as illustrated in FIG. 8C. So using a particular fiber drawing condition, the nanostructures 92 illustrated in FIG. 5A or FIG. 5B, will be the nanowire 104 during a portion of the fiber drawing process and the quantum dots 112 after the fiber drawing process is complete.

EXAMPLES OF DRAWING THERMOELECTRIC FIBERS

Example 1

In this example the three draw production sequence II of FIG. 1B is implemented. In the first production step 12 of FIG. 1B, the first preform is assembled with the geometry shown for the first preform 46 illustrated in FIG. 3A. Cylinder with cylindrical hole 48 is a 14 mm outer diameter, 6.36 mm inner diameter, 600 mm long cylinder of polyethersulfone. Rod 50 is made by inserting four 6.35 mm diameter, 150 mm long cylindrical bismuth rods into the cylinder with cylindrical hole 48. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 5 km long with a diameter of 108 um.

In the fourth production step 18 of FIG. 1B, the second preform is assembled with the geometry shown for the preform 80 illustrated in FIG. 4. Support 84 is made of a 14 mm outer diameter, 12 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1B, the second preform is consolidated in a vacuum oven at a pressure of $1\times10^{-3}$ torr and a temperature of 260° C. for 1 hour.

In the sixth production step 22 of FIG. 1B, a conventional fiber drawing tower is set to a temperature of 300° C. and used to draw the second preform into the second fiber that is 2.5 km long with a diameter of 108 um.

In the seventh production step 24 of FIG. 1B, the third preform is assembled with the geometry shown for the preform 80 illustrated in FIG. 4. Support 84 is made of a 14 mm outer diameter, 12 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1\times10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 1.25 km long with a diameter of 108 um.

In the optional anneal third fiber step 30 of FIG. 1B, the third fiber is heated in a vacuum oven to a temperature of 280° C. at a pressure of $1\times10^{-3}$ torr and then cooled to a temperature of 25° C. over a period of 12 hours.

The third fiber is the thermoelectric fiber 90 as illustrated in FIG. 5A. The thermoelectric fiber 90 is the nanostructures 92 embedded in the host 94. The host 94 is polyethersulfone. The nanostructures 92 are 5 nm diameter bismuth nanowires. If in the ninth production step 28 of FIG. 1B, the conventional fiber drawing tower was set to a temperature of 315° C., and used to draw the third preform into the third fiber, the nanostructures 92 would be 9.5 nm diameter bismuth quantum dots.

The thermoelectric fiber 90 is n-type because the rod 50 used to assembly the first preform 46 of FIG. 3A, was made of bismuth doped at a density of $2.07\times10^{18}$ cm$^{-3}$ with either Te atoms or Se atoms. The thermoelectric fiber could have been made p-type if the rod 50 was made of bismuth doped at a density of $2.59\times10^{18}$ cm$^{-3}$ with either Sn atoms or Pb atoms. The dopant densities of $2.07\times10^{18}$ cm$^{-3}$ and $2.59\times10^{18}$ cm$^{-3}$ were determined through a numeric ZT optimization process.

The thermoelectric fiber 90 of FIG. 5A can be cut into pieces and then assembled into thermoelectric devices for use in cooling or electric power generation applications.

Example 2

In this example the three draw production sequence 11 of FIG. 1B is implemented. In the first production step 12 of FIG. 1B, the first preform is assembled with the geometry shown for the first preform 46 illustrated in FIG. 3A. Cylinder with cylindrical hole 48 is a 28 mm outer diameter, 15.885 mm inner diameter, 600 mm long cylinder of polyethersulfone. Rod 50 is made by inserting four 15.875 mm diameter, 150 mm long cylindrical bismuth rods into the cylinder with cylindrical hole 48. The bismuth rods are n-type because they are doped at a density of $2.07\times10^{18}$ cm$^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1\times10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 6.5 km long with a diameter of 190 um.

In the fourth production step 18 of FIG. 1B, the second preform is assembled with the geometry shown for the preform 80 illustrated in FIG. 4. Support 84 is made of a 28 mm outer diameter, 26 mm inner diameter, 300 mm long cylinder of polyethersulfone. Fiber bundle 82 is assembled by cutting the first fiber into 300 mm long pieces and stacking them inside the support 84.

In the optional fifth production. step 20 of FIG. 1B, the second preform is consolidated in a vacuum oven at a pressure of $1\times10^{-3}$ torr and a temperature of 260° C. for 1 hour.

In the sixth production step 22 of FIG. 1B, a conventional fiber drawing tower is set to a temperature of 300° C. and used to draw the second preform into the second fiber that is 3.3 km long with a diameter of 190 um.

In the seventh production step 24 of FIG. 1B, the third preform is assembled with the geometry shown for the preform 80 illustrated in FIG. 4. Support 84 is made of a 28 mm outer diameter, 26 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1\times10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 1.7 km long with a diameter of 190 um.

In the optional anneal third fiber step 30 of FIG. 1B, the third fiber is heated in a vacuum oven to a temperature of 280° C. at a pressure of $1\times10^{-3}$ torr and then cooled to a temperature of 25° C. over a period of 12 hours.

The third fiber is the thermoelectric fiber 90 as illustrated in FIG. 5A. The thermoelectric fiber 90 is the nanostructures 92 embedded in the host 94. The host 94 is polyethersulfone. The nanostructures 92 are 5 nm diameter bismuth nanowires. If in the ninth production step 28 of FIG. 1B, the conventional fiber drawing tower was set to a temperature of 315° C., and used to draw the third preform into the third fiber, the nanostructures 92 would be 9.5 nm diameter bismuth quantum dots.

The thermoelectric fiber 90 is n-type because the rod 50 used to assembly the first preform 46 of FIG. 3A, was made of bismuth doped at a density of $2.07\times10^{18}$ cm$^{-3}$ with either Te atoms or Se atoms. The thermoelectric fiber could have been made p-type if the rod 50 was made of bismuth doped at a density of $2.59\times10^{18}$ cm$^{-3}$ with either Sn atoms or Pb atoms. The dopant densities of $2.07\times10^{18}$ cm$^{-3}$ and $2.59\times10^{18}$ cm$^{3}$ were determined through a numeric ZT optimization process.

The thermoelectric fiber 90 of FIG. 5A can be cut into pieces and then assembled into thermoelectric devices for use in cooling or electric power generation applications.

Example 3

In this example the three draw production sequence 11 of FIG. 1B is implemented. In the first production step 12 of FIG. 1B, the first preform is assembled with the geometry shown for the first preform 46 illustrated in FIG. 3A. Cylinder with cylindrical hole 48 is a 14.2 mm outer diameter, 6.36 mm inner diameter, 600 mm long cylinder of polyethersulfone. Rod 50 is made by inserting four 6.35 mm diameter, 150 mm long cylindrical bismuth rods into the cylinder with cylindrical hole 48. The bismuth rods are n-type because they are doped at a density of $2.07 \times 10^{18}$ $cm^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 2.2 km long with a diameter of 165 um.

In the fourth production step 18 of FIG. 1B, the second preform is assembled with the geometry shown for the preform 80 illustrated in FIG. 4. Support 84 is made of a 14.2 mm outer diameter, 12.2 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1B, the second preform is consolidated in a vacuum oven at a pressure of 1 torr and a temperature of 260° C. for 1 hour.

In the sixth production step 22 of FIG. 1B, a conventional fiber drawing tower is set to a temperature of 300° C. and used to draw the second preform into the second fiber that is 1.1 km long with a diameter of 165 um.

In the seventh production step 24 of FIG. 1B, the third preform is assembled with the geometry shown for the preform 80 illustrated in FIG. 4. Support 84 is made of a 14.2 mm outer diameter, 12.2 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1 \times 10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 0.55 km long with a diameter of 165 um.

In the optional anneal third fiber step 30 of FIG. 1B, the third fiber is heated in a vacuum oven to a temperature of 280° C. at a pressure of $1 \times 10^{-3}$ torr and then cooled to a temperature of 25° C. over a period of 12 hours.

The third fiber is the thermoelectric fiber 90 as illustrated in FIG. 5A. The thermoelectric fiber 90 is the nanostructures 92 embedded in the host 94. The host 94 is polyethersulfone. The nanostructures 92 are 10 nm diameter bismuth nanowires. If in the ninth production step 28 of FIG. 1B, the conventional fiber drawing tower was set to a temperature of 318° C., and used to draw the third preform into the third fiber, the nanostructures 92 would be 18.9 nm diameter bismuth quantum dots.

The thermoelectric fiber 90 is n-type because the rod 50 used to assembly the first preform 46 of FIG. 3A, was made of bismuth doped at a density of $2.07 \times 10^{18}$ $cm^{-3}$ with either Te atoms or Se atoms. The thermoelectric fiber could have been made p-type if the rod 50 was made of bismuth doped at a density of $2.59 \times 10^{18}$ $cm^{-3}$ with either Sn atoms or Pb atoms. The dopant densities of $2.07 \times 10^{18}$ $cm^{-3}$ and $2.59 \times 10^{18}$ $cm^{-3}$ were determined through a numeric ZT optimization process.

The thermoelectric fiber 90 of FIG. 5A can be cut into pieces and then assembled into thermoelectric devices for use in cooling or electric power generation applications.

Example 4

In this example the three draw production sequence 11 of FIG. 1B is implemented. In the first production step 12 of FIG. 1B, the first preform is assembled with the geometry shown for the first preform 46 illustrated in FIG. 3A. Cylinder with cylindrical hole 48 is a 11 mm outer diameter, 6.36 mm inner diameter, 600 mm long cylinder of polyethersulfone. Rod 50 is made by inserting four 6.35 mm diameter, 150 mm long cylindrical bismuth rods into the cylinder with cylindrical hole 48. The bismuth rods are n-type because they are doped at a density of $2.07 \times 10^{18}$ $cm^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 2.2 km long with a diameter of 128 um.

In the fourth production step 18 of FIG. 1B, the second preform is assembled with the geometry shown for the preform 80 illustrated in FIG. 4. Support 84 is made of a 11 mm outer diameter, 9.5 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1B, the second preform is consolidated in a vacuum oven at a pressure of $1 \times 10^{-3}$ torr and a temperature of 260° C. for 1 hour.

In the sixth production step 22 of FIG. 1B, a conventional fiber drawing tower is set to a temperature of 300° C. and used to draw the second preform into the second fiber that is 1.1 km long with a diameter of 128 um.

In the seventh production step 24 of FIG. 1B, the third preform is assembled with the geometry shown for the preform 80 illustrated in FIG. 4. Support 84 is made of a 11 mm outer diameter, 9.5 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1 \times 10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 0.55 km long with a diameter of 128 um.

In the optional anneal third fiber step 30 of FIG. 1B, the third fiber is heated in a vacuum oven to a temperature of 280° C. at a pressure of $1 \times 10^{-3}$ torr and then cooled to a temperature of 25° C. over a period of 12 hours.

The third fiber is the thermoelectric fiber 90 as illustrated in FIG. 5A. The thermoelectric fiber 90 is the nanostructures 92 embedded in the host 94. The host 94 is polyethersulfone. The nanostructures 92 are 10 nm diameter bismuth nanowires. If in the ninth production step 28 of FIG. 1B, the conventional fiber drawing tower was set to a temperature of 318° C., and used to draw the third preform into the third fiber, the nanostructures 92 would be 18.9 nm diameter bismuth quantum dots.

The thermoelectric fiber 90 is n-type because the rod 50 used to assembly the first preform 46 of FIG. 3A, was made of bismuth doped at a density of $2.07 \times 10^{18}$ cm$^{-3}$ with either Te atoms or Se atoms. The thermoelectric fiber could have been made p-type if the rod 50 was made of bismuth doped at a density of $2.59 \times 10^{18}$ cm$^{-3}$ with either Sn atoms or Pb atoms. The dopant densities of $2.07 \times 10^{18}$ cm$^{-3}$ and $2.59 \times 10^{18}$ cm$^{-3}$ were determined through a numeric ZT optimization process.

The thermoelectric fiber 90 of FIG. 5A can be cut into pieces and then assembled into thermoelectric devices for use in cooling or electric power generation applications.

Example 5

In this example the two draw production sequence 10 of FIG. 1A is implemented. In the first production step 12 of FIG. 1A, the first preform is assembled with the geometry shown for the first preform 52 illustrated in FIG. 3B. Cylinder with cylindrical holes 54 is a 63 mm outer diameter, 600 mm long cylinder of polyethersulfone containing nineteen 6.36 diameter, 600 mm long holes that have a center to center spacing of 12.6 mm. Rod array 56 is made by inserting seventy-six 6.35 mm diameter, 150 mm long cylindrical bismuth rods into the cylinder with cylindrical holes 54. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1A, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1A, a conventional fiber drawing tower is set to a temperature of 300° C. and used to draw the first preform into the first fiber that is 191 km long with a diameter of 79 um.

In the fourth production step 18 of FIG. 1A, the second preform is assembled with the geometry shown for the preform 80 illustrated in FIG. 4. Support 84 is made of a 63 mm outer diameter, 60 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1A, the second preform is consolidated in a vacuum oven at a pressure of $1 \times 10^{-3}$ torr and a temperature of 260° C. for 1 hour.

In the sixth production step 22 of FIG. 1A, a conventional fiber drawing tower is set to a temperature of 300° C. and used to draw the second preform into the second fiber that is 96 km long with a diameter of 79 um.

In the optional anneal second fiber step 23 of FIG. 1A, the second fiber is heated in a vacuum oven to a temperature of 280° C. at a pressure of $1 \times 10^{-3}$ torr and then cooled to a temperature of 25° C. over a period of 12 hours.

The second fiber is the thermoelectric fiber 90 as illustrated in FIG. 5A. The thermoelectric fiber 90 is the nanostructures 92 embedded in the host 94. The host 94 is polyethersulfone. The nanostructures 92 are 10 nm diameter bismuth nanowires. If in the sixth production step 22 of FIG. 1A, the conventional fiber drawing tower was set to a temperature of 318° C., and used to draw the second preform into the second fiber, the nanostructures 92 would be 18.9 nm diameter bismuth quantum dots.

The thermoelectric fiber 90 is n-type because the rod array 56 used to assembly the first preform 52 of FIG. 3B, was made of bismuth doped at a density of $2.07 \times 10^{18}$ cm$^{-3}$ with either Te atoms or Se atoms. The thermoelectric fiber could have been made p-type if the rod array 56 was made of bismuth doped at a density of $2.59 \times 10^{18}$ cm$^{-3}$ with either Sn atoms or Pb atoms. The dopant densities of $2.07 \times 10^{18}$ cm$^{-3}$ and $2.59 \times 10^{18}$ cm$^{-3}$ were determined through a numeric ZT optimization process.

The thermoelectric fiber 90 of FIG. 5A can be cut into pieces and then assembled into thermoelectric devices for use in cooling or electric power generation applications.

Example 6

In this example the two draw production sequence 10 of FIG. 1A is implemented. In the first production step 12 of FIG. 1A, the first preform is assembled with the geometry shown for the first preform 52 illustrated in FIG. 3B. Cylinder with cylindrical holes 54 is a 48 mm outer diameter, 600 mm long cylinder of polyethersulfone containing nineteen 3.185 diameter, 600 mm long holes that have a center to center spacing of 9.6 mm. Rod array 56 is made by inserting seventy-six 3.175 mm diameter, 150 mm long cylindrical bismuth rods into the cylinder with cylindrical holes 54. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1A, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1A, a conventional fiber drawing tower is set to a temperature of 300° C. and used to draw the first preform into the first fiber that is 191 km long with a diameter of 60 um.

In the fourth production step 18 of FIG. 1A, the second preform is assembled with the geometry shown for the preform 80 illustrated in FIG. 4. Support 84 is made of a 48 mm outer diameter, 46 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1A, the second preform is consolidated in a vacuum oven at a pressure of $1 \times 10^{-3}$ torr and a temperature of 260° C. for 1 hour.

In the sixth production step 22 of FIG. 1A, a conventional fiber drawing tower is set to a temperature of 300° C. and used to draw the second preform into the second fiber that is 96 km long with a diameter of 60 um.

In the optional anneal second fiber step 23 of FIG. 1A, the second fiber is heated in a vacuum oven to a temperature of 280° C. at a pressure of $1 \times 10^{-3}$ torr and then cooled to a temperature of 25° C. over a period of 12 hours.

The second fiber is the thermoelectric fiber 90 as illustrated in FIG. 5A. The thermoelectric fiber 90 is the nanostructures 92 embedded in the host 94. The host 94 is polyethersulfone. The nanostructures 92 are 5 nm diameter bismuth nanowires. If in the sixth production step 22 of FIG. 1A, the conventional fiber drawing tower was set to a temperature of 315° C., and used to draw the second preform into the second fiber, the nanostructures 92 would be 9.5 nm diameter bismuth quantum dots.

The thermoelectric fiber 90 is n-type because the rod array 56 used to assembly the first preform 52 of FIG. 3B, was made of bismuth doped at a density of $2.07 \times 10^{18}$ cm$^{-3}$ with either Te atoms or Se atoms. The thermoelectric fiber could have been made p-type if the rod array 56 was made of bismuth doped at a density of $2.59 \times 10^8$ cm$^{-3}$ with either Sn atoms or Pb atoms. The dopant densities of $2.07 \times 10^{18}$ cm$^{-3}$ and $2.59 \times 10^{18}$ cm$^{-3}$ were, determined through a numeric ZT optimization process.

The thermoelectric fiber 90 of FIG. 5A can be cut into pieces and then assembled into thermoelectric devices for use in cooling or electric power generation applications.

Example 7

In this example the three draw production sequence 11 of FIG. 1B is implemented. In the first production step 12 of FIG. 1B, the first preform is assembled with the geometry shown for the first preform 72 illustrated in FIG. 3D. Cylinder with cylindrical hole 62 is a 7.12 mm outer diameter, 3.185 mm inner diameter, 600 mm long cylinder of polyetherimide. Cylinder with cylindrical hole 64 is a 7.12 mm outer diameter, 3.185 mm inner diameter, 600 mm long cylinder of polysulfone. Cylinder with cylindrical hole 66 is a 7.12 mm outer diameter, 3.185 mm inner diameter, 600 mm long cylinder of polyethersulfone. Rod array 56 is made by inserting four 3.175 mm diameter, 150 mm long cylindrical bismuth rods into each cylinder with cylindrical hole 62, cylinder with cylindrical hole 64, and cylinder with cylindrical hole 66. A total of seventy-six bismuth rods are needed to assemble the rod array 56. Support 74 is five layers of 0.2 mm thick, 600 mm wide polyethersulfone sheet that is held in place by bonding the sheet layers together using a heat gun or a glue that can maintain bonds at a temperature of 300° C. for 1 hour. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 2.2 km long with a diameter of 414 um.

In the fourth production step 18 of FIG. 1B, the second preform is assembled with the geometry shown for the preform 80 illustrated in FIG. 4. Support 84 is made of a 35.6 mm outer diameter, 33.6 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1B, the second preform is consolidated in a vacuum oven at a pressure of $1 \times 10^{-3}$ torr and a temperature of 260° C. for 1 hour.

In the sixth production step 22 of FIG. 1B, a conventional fiber drawing tower is set to a temperature of 300° C. and used to draw the second preform into the second fiber that is 1.1 km long with a diameter of 414 um.

In the seventh production step 24 of FIG. 1B, the third preform is assembled with the geometry shown for the preform 80 illustrated in FIG. 4. Support 84 is made of a 35.6 mm outer diameter, 33.6 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1 \times 10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 0.55 km long with a diameter of 414 um.

In the optional anneal third fiber step 30 of FIG. 1B, the third fiber is heated in a vacuum oven to a temperature of 280° C. at a pressure of $1 \times 10^{-3}$ torr and then cooled to a temperature of 25° C. over a period of 12 hours.

The third fiber is the thermoelectric fiber 96 as illustrated in FIG. 5B. The thermoelectric fiber 96 is the nanostructures 92 embedded in the nanotubes 98. The nanotubes 98 are comprised of polyetherimide nanotubes, polysulfone nanotubes, and polyethersulfone nanotubes. The nanostructures 92 are 5 nm diameter bismuth nanowires. If in the ninth production step 28 of FIG. 1B, the conventional fiber drawing tower was set to a temperature of 315° C., and used to draw the third preform into the third fiber, the nanostructures 92 would be 9.5 nm diameter bismuth quantum dots.

The thermoelectric fiber 96 is n-type because the rod array 56 used to assembly the first preform 72 illustrated in FIG. 3D, was made of bismuth doped at a density of $2.07 \times 10^{18}$ cm$^{-3}$ with either Te atoms or Se atoms. The thermoelectric fiber could have been made p-type if the rod array 56 was made of bismuth doped at a density of $2.59 \times 10^{18}$ cm$^{-3}$ with either Sn atoms or Pb atoms. The dopant densities of $2.07 \times 10^{18}$ cm$^{-3}$ and $2.59 \times 10^{18}$ cm$^{-3}$ were determined through a numeric ZT optimization process.

The thermoelectric fiber 96 of FIG. 5B can be cut into pieces and then assembled into thermoelectric devices for use in cooling or electric power generation applications.

Example 8

In this example the three draw production sequence 11 of FIG. 1B is implemented. In the first production step 12 of FIG. 1B, the first preform is assembled with the geometry shown for the first preform 72 illustrated in FIG. 3D. Cylinder with cylindrical hole 62 is a 5.6 mm outer diameter, 3.185 mm inner diameter, 600 mm long cylinder of polyetherimide. Cylinder with cylindrical hole 64 is a 5.6 mm outer diameter, 3.185 mm inner diameter, 600 mm long cylinder of polysulfone. Cylinder with cylindrical hole 66 is a 5.6 mm outer diameter, 3.185 mm inner diameter, 600 mm long cylinder of polyethersulfone. Rod array 56 is made by inserting four 3.175 mm diameter, 150 mm long cylindrical bismuth rods into each cylinder with cylindrical hole 62, cylinder with cylindrical hole 64, and cylinder with cylindrical hole 66. A total of seventy-six bismuth rods are needed to assemble the rod array 56. Support 74 is five layers of 0.2 mm thick, 600 mm wide polyethersulfone sheet that is held in place by bonding the sheet layers together using a heat gun or a glue that can maintain bonds at a temperature of 300° C. for 1 hour. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1\times10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 2.2 km long with a diameter of 325 um.

In the fourth production step 18 of FIG. 1B, the second preform is assembled with the geometry shown for the preform 80 illustrated in FIG. 4. Support 84 is made of a 28 mm outer diameter, 26 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1B, the second preform is consolidated in a vacuum oven at a pressure of $1\times10^{-3}$ torr and a temperature of 260° C. for 1 hour.

In the sixth production step 22 of FIG. 1B, a conventional fiber drawing tower is set to a temperature of 300° C. and used to draw the second preform into the second fiber that is 1.1 km long with a diameter of 325 um.

In the seventh production step 24 of FIG. 1B, the third preform is assembled with the geometry shown for the preform 80 illustrated in FIG. 4. Support 84 is made of a 28 mm outer diameter, 26 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1\times10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 0.55 km long with a diameter of 325 um.

In the optional anneal third fiber step 30 of FIG. 1B, the third fiber is heated in a vacuum oven to a temperature of 280° C. at a pressure of $1\times10^{-3}$ torr and then cooled to a temperature of 25° C. over a period of 12 hours.

The third fiber is the thermoelectric fiber 96 as illustrated in FIG. 5B. The thermoelectric fiber 96 is the nanostructures 92 embedded in the nanotubes 98. The nanotubes 98 are comprised of polyetherimide nanotubes, polysulfone nanotubes, and polyethersulfone nanotubes. The nanostructures 92 are made of 5 nm diameter bismuth nanowires. If in the ninth production step 28 of FIG. 1B, the conventional fiber drawing tower was set to a temperature of 315° C., and used to draw the third preform into the third fiber, the nanostructures 92 would be 9.5 nm diameter bismuth quantum dots.

The thermoelectric fiber 96 is n-type because the rod array 56 used to assembly the first preform 72 illustrated in FIG. 3D, was made of bismuth doped at a density of $2.07\times10^{18}$ $cm^{-3}$ with either Te atoms or Se atoms. The thermoelectric fiber could have been made p-type if the rod array 56 was made of bismuth doped at a density of $2.59\times10^{18}$ $cm^{-3}$ with either Sn atoms or Pb atoms. The dopant densities of $2.07\times10^{18}$ $cm^{-3}$ and $2.59\times10^{18}$ $cm^{-3}$ were determined through a numeric ZT optimization process.

The thermoelectric fiber 96 of FIG. 5B can be cut into pieces and then assembled into thermoelectric devices for use in cooling or electric power generation applications.

Example 9

In this example the three draw production sequence 11 of FIG. 1B is implemented. In the first production step 12 of FIG. 1B, the first preform is assembled with the geometry shown for the first preform 72 illustrated in FIG. 3D. Cylinder with cylindrical hole 62 is a 4.8 mm outer diameter, 3.185 mm inner diameter, 600 mm long cylinder of polyetherimide. Cylinder with cylindrical hole 64 is a 4.8 mm outer diameter, 3.185 mm inner diameter, 600 mm long cylinder of polysulfone. Cylinder with cylindrical hole 66 is a 4.8 mm outer diameter, 3.185 mm inner diameter, 600 mm long cylinder of polyethersulfone. Rod array 56 is made by inserting four 3.175 mm diameter, 150 mm long cylindrical bismuth rods into each cylinder with cylindrical hole 62, cylinder with cylindrical hole 64, and cylinder with cylindrical hole 66. A total of seventy-six bismuth rods are needed to assemble the rod array 56. Support 74 is five layers of 0.2 mm thick, 600 mm wide polyethersulfone sheet that is held in place by bonding the sheet layers together using a heat gun or a glue that can maintain bonds at a temperature of 300° C. for 1 hour. The bismuth rods are n-type because they are doped at a density of $2.07\times10^{18}$ $cm^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1\times10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 2.2 km long with a diameter of 279 um.

In the fourth production step 18 of FIG. 1B, the second preform is assembled with the geometry shown for the preform 80 illustrated in FIG. 4. Support 84 is made of a 24 mm outer diameter, 22 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1B, the second preform is consolidated in a vacuum oven at a pressure of $1\times10^{-3}$ torr and a temperature of 260° C. for 1 hour.

In the sixth production step 22 of FIG. 1B, a conventional fiber drawing tower is set to a temperature of 300° C. and used to draw the second preform into the second fiber that is 1.1 km long with a diameter of 279 um.

In the seventh production step 24 of FIG. 1B, the third preform is assembled with the geometry shown for the preform 80 illustrated in FIG. 4. Support 84 is made of a 24 mm outer diameter, 22 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1\times10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 0.55 km long with a diameter of 279 um.

In the optional anneal third fiber step 30 of FIG. 1B, the third fiber is heated in a vacuum oven to a temperature of 280° C. at a pressure of $1\times10^{-3}$ torr and then cooled to a temperature of 25° C. over a period of 12 hours.

The third fiber is the thermoelectric fiber 96 as illustrated in FIG. 5B. The thermoelectric fiber 96 is the nanostructures 92 embedded in the nanotubes 98. The nanotubes 98 are comprised of polyetherimide nanotubes, polysulfone nanotubes, and polyethersulfone nanotubes. The nanostructures 92 are made of 5 nm diameter bismuth nanowires. If in the ninth production step 28 of FIG. 1B, the conventional fiber drawing tower was set to a temperature of 315° C., and used to draw the third preform into the third fiber, the nanostructures 92 would be 9.5 nm diameter bismuth quantum dots.

The thermoelectric fiber 96 is n-type because the rod array 56 used to assembly the first preform 72 illustrated in FIG. 3D, was made of bismuth doped at a density of $2.07 \times 10^8$ cm$^{-3}$ with either Te atoms or Se atoms. The thermoelectric fiber could have been made p-type if the rod array 56 was made of bismuth doped at a density of $2.59 \times 10^{18}$ cm$^{-3}$ with either Sn atoms or Pb atoms. The dopant densities of $2.07 \times 10^{18}$ cm$^{-3}$ and $2.59 \times 10^{18}$ cm$^{-3}$ were determined through a numeric ZT optimization process.

The thermoelectric fiber 96 of FIG. 5B can be cut into pieces and then assembled into thermoelectric devices for use in cooling or electric power generation applications.

Example 10

In this example the three draw production sequence 11 of FIG. 1B is implemented. In the first production step 12 of FIG. 1B, the first preform is assembled with the geometry shown for the first preform 72 illustrated in FIG. 3D. Cylinder with cylindrical hole 62 is a 14.24 mm outer diameter, 6.36 mm inner diameter, 600 mm long cylinder of polyetherimide. Cylinder with cylindrical hole 64 is a 14.24 mm outer diameter, 6.36 mm inner diameter, 600 mm long cylinder of polysulfone. Cylinder with cylindrical hole 66 is a 14.24 mm outer diameter, 6.36 mm inner diameter, 600 mm long cylinder of polyethersulfone. Rod array 56 is made by inserting four 6.35 mm diameter, 150 mm long cylindrical bismuth rods into each cylinder with cylindrical hole 62, cylinder with cylindrical hole 64, and cylinder with cylindrical hole 66. A total of seventy-six bismuth rods are needed to assemble the rod array 56. Support 74 is five layers of 0.2 mm thick, 600 mm wide polyethersulfone sheet that is held in place by bonding the sheet layers together using a heat gun or a glue that can maintain bonds at a temperature of 300° C. for 1 hour. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1B, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1B, a conventional fiber drawing tower is set to a temperature of 300° C. and used to draw the first preform into the first fiber that is 2.2 km long with a diameter of 827 um.

In the fourth production step 18 of FIG. 1B, the second preform is assembled with the geometry shown for the preform 80 illustrated in FIG. 4. Support 84 is made of a 71.2 mm outer diameter, 69.2 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1B, the second preform is consolidated in a vacuum oven at a pressure of $1 \times 10^{-3}$ torr and a temperature of 260° C. for 1 hour.

In the sixth production step 22 of FIG. 1B, a conventional fiber drawing tower is set to a temperature of 300° C. and used to draw the second preform into the second fiber that is 1.1 km long with a diameter of 827 um.

In the seventh production step 24 of FIG. 1B, the third preform is assembled with the geometry shown for the preform 80 illustrated in FIG. 4. Support 84 is made of a 71.2 mm outer diameter, 69.2 mm inner diameter, 150 mm long cylinder of polyethersulfone. Fiber bundle 82 is assembled by cutting the second fiber into 150 mm long pieces and stacking them inside the support 84.

In the optional eighth production step 26 of FIG. 1B, the third preform is consolidated in a vacuum oven at a pressure of $1 \times 10^{-3}$ torr and a temperature of 260° C. for 1 hour.

In the ninth production step 28 of FIG. 1B, a conventional fiber drawing tower is set to a temperature of 300° C. and used to draw the third preform into the third fiber that is 0.55 km long with a diameter of 827 um.

In the optional anneal third fiber step 30 of FIG. 1B, the third fiber is heated in a vacuum oven to a temperature of 280° C. at a pressure of $1 \times 10^{-3}$ torr and then cooled to a temperature of 25° C. over a period of 12 hours.

The third fiber is the thermoelectric fiber 96 as illustrated in FIG. 5B. The thermoelectric fiber 96 is the nanostructures 92 embedded in the nanotubes 98. The nanotubes 98 are comprised of polyetherimide nanotubes, polysulfone nanotubes, and polyethersulfone nanotubes. The nanostructures 92 are made of 10 nm diameter bismuth nanowires. If in the ninth production step 28 of FIG. 1B, the conventional fiber drawing tower was set to a temperature of 318° C., and used to draw the third preform into the third fiber, the nanostructures 92 would be 18.9 nm diameter bismuth quantum dots.

The thermoelectric fiber 96 is n-type because the rod array 56 used to assembly the first preform 72 illustrated in FIG. 3D, was made of bismuth doped at a density of $2.07 \times 10^{18}$ cm$^{-3}$ with either Te atoms or Se atoms. The thermoelectric fiber could have been made p-type if the rod array 56 was made of bismuth doped at a density of $2.59 \times 10^{18}$ cm$^{-3}$ with either Sn atoms or Pb atoms. The dopant densities of $2.07 \times 10^{18}$ cm$^{-3}$ and $2.59 \times 10^{18}$ cm$^{-3}$ were determined through a numeric ZT optimization process.

The thermoelectric fiber 96 of FIG. 5B can be cut into pieces and then assembled into thermoelectric devices for use in cooling or electric power generation applications.

Example 11

In this example the two draw production sequence 10 of FIG. 1A is implemented. In the first production step 12 of FIG. 1A, the first preform is assembled with the geometry shown for the first preform 52 illustrated in FIG. 3B. Cylinder with cylindrical holes 54 is a 63 mm outer diameter, 600 mm long cylinder of polyethersulfone containing nineteen 6.36 diameter, 600 mm long holes that have a center to center spacing of 12.6 mm. Rod array 56 is made by inserting seventy-six 6.35 mm diameter, 150 mm long cylindrical bismuth rods into the cylinder with cylindrical holes 54. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1A, the first preform ends are sealed with a 1 mm thick polyethersulfone sheet and then the first preform is consolidated in a vacuum oven at a pressure of $1 \times 10^{-3}$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1A, a conventional fiber drawing tower is set to a temperature of 300° C. and used to draw the first preform into the first fiber that is 93 kin long with a diameter of 113 um.

In the fourth production step 18 of FIG. 1A, the second preform is assembled with the geometry shown for the preform 80 illustrated in FIG. 4. Support 84 is made of a 63 mm outer diameter, 60 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1A, the second preform is consolidated in a vacuum oven at a pressure of $1 \times 10^{-3}$ torr and a temperature of 260° C. for 1 hour.

In the sixth production step 22 of FIG. 1A, a conventional fiber drawing tower is set to a temperature of 300° C. and used to draw the second preform into the second fiber that is 47 km long with a diameter of 113 um.

In the optional anneal second fiber step 23 of FIG. 1A, the second fiber is heated in a vacuum oven to a temperature of 280° C. at a pressure of $1 \times 10^{-3}$ torr and then cooled to a temperature of 25° C. over a period of 12 hours.

The second fiber is the thermoelectric fiber 90 as illustrated in FIG. 5A. The thermoelectric fiber 90 is the nanostructures 92 embedded in the host 94. The host 94 is polyethersulfone. The nanostructures 92 are made of 20 nm diameter bismuth nanowires. If in the sixth production step 22 of FIG. 1A, the conventional fiber drawing tower was set to a temperature of 322° C., and used to draw the second preform into the second fiber, the nanostructures 92 would be 37.8 nm diameter bismuth quantum dots.

The thermoelectric fiber 90 is n-type because the rod array 56 used to assembly the first preform 52 of FIG. 3B, was made of bismuth doped at a density of $2.07 \times 10^{18}$ cm$^{-3}$ with either Te atoms or Se atoms. The thermoelectric fiber could have been made p-type if the rod array 56 was made of bismuth doped at a density of $2.59 \times 10^{18}$ cm$^{-3}$ with either Sn atoms or Pb atoms. The dopant densities of $2.07 \times 10^{18}$ cm$^{-3}$ and $2.59 \times 10^{18}$ cm$^{-3}$ were determined through a numeric ZT optimization process.

The thermoelectric fiber 90 of FIG. 5A can be cut into pieces and then assembled into thermoelectric devices for use in cooling or electric power generation applications.

Example 12

In this example the two draw production sequence 10 of FIG. 1A is implemented. In the first production step 12 of FIG. 1A, the first preform is assembled with the geometry shown for the first preform 72 illustrated in FIG. 3D. Cylinder with cylindrical hole 62 is a 12.6 mm outer diameter, 6.36 mm inner diameter, 600 mm long cylinder of polyethersulfone. Cylinder with cylindrical hole 64 is a 12.6 mm outer diameter, 6.36 mm inner diameter, 600 mm long cylinder of polyethersulfone. Cylinder with cylindrical hole 66 is a 12.6 mm outer diameter, 6.36 mm inner diameter, 600 mm long cylinder of polyethersulfone. Rod array 56 is made by inserting four 6.35 mm diameter, 150 mm long cylindrical bismuth rods into each cylinder with cylindrical hole 62, cylinder with cylindrical hole 64, and cylinder with cylindrical hole 66. A total of seventy-six bismuth rods are needed to assemble the rod array 56. Support 74 is five layers of 0.2 mm thick, 600 mm wide polyethersulfone sheet that is held in place by bonding the sheet layers together using a heat gun or a glue that can maintain bonds at a temperature of 300° C. for 1 hour. The bismuth rods are n-type because they are doped at a density of $2.07 \times 10^{18}$ cm$^{-3}$ with either Te atoms or Se atoms. The first preform is assembled in a glove box filled with argon at a pressure of 1 atm and a temperature of 25° C.

In the optional second production step 14 of FIG. 1A, the first preform ends are sealed with a 1 mm thick polyethersulfone sheet and then the first preform is consolidated in a vacuum oven at a pressure of $1 \times 10$ torr and a temperature of 260° C. for 1 hour. Sealing the polyethersulfone sheet to the preform ends can be accomplished using a heat gun or a glue that can maintain bonds at a temperature of 300° C. for 1 hour.

In the third production step 16 of FIG. 1A, a conventional fiber drawing tower is set to a temperature of 300° C. and used to draw the first preform into the first fiber that is 93 km long with a diameter of 113 um.

In the fourth production step 18 of FIG. 1A, the second preform is assembled with the geometry shown for the preform 80 illustrated in FIG. 4. Support 84 is made of a 63 mm outer diameter, 60 mm inner diameter, 300 mm long cylinder of polyethersulfone. Fiber bundle 82 is assembled by cutting the first fiber into 300 mm long pieces and stacking them inside the support 84.

In the optional fifth production step 20 of FIG. 1A, the second preform is consolidated in a vacuum oven at a pressure of $1 \times 10^{-3}$ torr and a temperature of 260° C. for 1 hour.

In the sixth production step 22 of FIG. 1A, a conventional fiber drawing tower is set to a temperature of 300° C. and used to draw the second preform into the second fiber that is 47 km long with a diameter of 113 um.

In the optional anneal second fiber step 23 of FIG. 1A, the second fiber is heated in a vacuum oven to a temperature of 280° C. at a pressure of $1 \times 10^{-3}$ torr and then cooled to a temperature of 25° C. over a period of 12 hours.

The second fiber is the thermoelectric fiber 90 as illustrated in FIG. 5A. The thermoelectric fiber 90 is the nanostructures 92 embedded in the host 94. The host 94 is comprised of polyethersulfone. The nanostructures 92 are made of 20 nm diameter bismuth nanowires. If in the sixth production step 22 of FIG. 1A, the conventional fiber drawing tower was set to a temperature of 322° C., and used to draw the second preform into the second fiber, the nanostructures 92 would be 37.8 nm diameter bismuth quantum dots.

The thermoelectric fiber 90 is n-type because the rod array 56 used to assembly the first preform 72 illustrated in FIG. 3D, was made of bismuth doped at a density of $2.07 \times 10^{18}$ cm$^{-3}$ with either Te atoms or Se atoms. The thermoelectric fiber could have been made p-type if the rod array 56 was made of bismuth doped at a density of $2.59 \times 10^{18}$ cm$^{-3}$ with either Sn atoms or Pb atoms. The dopant densities of $2.07 \times 10^{18}$ cm$^{-3}$ and $2.59 \times 10^{18}$ cm$^{-3}$ were determined through a numeric ZT optimization process.

The thermoelectric fiber 90 of FIG. 5A can be cut into pieces and then assembled into thermoelectric devices for use in cooling or electric power generation applications.

Advantages

From the description above, a number of advantages of some embodiments of my method of producing nanowires become evident:

(a) The nanostructures produced are embedded in a host that can be made of a polymer or combination of polymers. Polymers have very low thermal conductivities, about ¼ that of most glasses. Embedding the nanostructures in a low thermal conductivity host improves ZT of the nanostructure-host composite or thermoelectric fiber.

(b) The nanostructures produced are embedded in a host that can assume the form of nanotubes which further reduces the host's thermal conductivity due to phonon scattering at the nanotube's inner and outer surfaces. Embedding the nanostructures in a low thermal conductivity host improves ZT of the nanostructure-host composite or thermoelectric fiber.

(c) The nanostructures produced are embedded in a host that can be made to exhibit anisotropic thermal conductivity. By orienting the thermoelectric fiber such that the direction in which it was drawn is perpendicular to the applied temperature gradient, ZT of the thermoelectric fiber will increase because the thermoelectric fiber's thermal conductivity is lowest in this orientation.

CONCLUSIONS, RAMIFICATIONS, AND SCOPE

Accordingly, the reader will see that the method of producing nanostructures of the various embodiments can be used to make nanowires or quantum dots embedded in a host made of a polymer or combination of polymers, which have a much lower thermal conductivity than most glasses. In addition, the host can take the form of nanotubes which further reduces the host thermal conductivity because of enhanced phonon scattering at the nanotubes' inner and outer surfaces. Embedding the nanostructures in a low thermal conductivity host improves ZT of the nanostructure-host composite or thermoelectric fiber. Furthermore, this host can be made to exhibit anisotropic thermal conductivity. By orienting the thermoelectric fiber such that the direction in which it was drawn is perpendicular to the applied temperature gradient, ZT of the thermoelectric fiber will increase due to a reduction in its thermal conductivity.

Although the description above contains many specificities, these should not be construed as limiting the scope of the embodiments but merely providing illustrations of some of the presently preferred embodiments. For example:

- The two draw production sequence can be reduced to a single draw production sequence resulting in the elimination of the fourth production step, optional fifth production step, and sixth production step;
- The three draw production sequence can be increased to a four or more draw production sequence resulting in additional preform assemble and drawing steps;
- The optional second production step, optional fifth production step, optional eighth production step, optional anneal second fiber step, and optional anneal third fiber step are optional steps because they can improve the production yield and/or ZT for some, but not all materials that can be used for the composition of the nanostructure-host composites;
- The production waste of the rod, rod array, wire, or nanostructure material can be reduced by assembling preforms in which this material does not exist on some length or portion of the preform ends;
- The support can be a permanent support such as a rigid cylinder, flexible wrap, cured layer of glue, etc., or a temporary support that is removed from the preform after the preform is consolidated;
- It is not necessary for the support to exist along the full length of the preform. For example; the support may only exist on the preform ends so that ¾ of the middle section of the preform has no support;
- The rod array and cylinder with cylindrical hole array can take the form of various geometric patterns;
- The rod or rod array can be made of bismuth or other material that exhibits the desired thermoelectric properties or ZT values;
- The thermoelectric fiber can be made n-type or p-type by using the appropriate dopant to dope the rod or rod array. For example, Te or Se atoms make bismuth n-type and Sn or Pb atoms make bismuth p-type;
- The optimal dopant density in the rod or rod array depends on the material of the rod or rod array and its application operating temperature. The optimal dopant density can be determined through a numeric or experimental ZT optimization process;
- The optimal conditions (i.e. temperature, pressure, etc.) and time needed for preform consolidation and fiber annealing depends on the materials in which the preform is made of;
- The optimal settings (i.e. temperature, draw speed, etc.) used for the conventional fiber drawing tower for the fiber drawing process depends on the materials in which the preform is made of and the thermal characteristics of the drawing tower;

Thus the scope of the embodiments should be determined by the appended claims and their legal equivalents, rather than by the examples given.

I claim:

1. A method for making a multitude of quantum dots embedded in a host, comprising:
   (a) assembling a plurality of materials into a preform,
   (b) drawing said preform into a fiber having a longitudinal dimension and a cross-sectional dimension,
   (c) inducing an instability in said fiber,
   whereby said longitudinal dimension of said fiber is substantially larger than said cross-sectional dimension of said fiber, at least one but not all of said materials is transformed into said quantum dots embedded in said host, and a multitude of said quantum dots do not make physical contact with one another.

2. The method of claim 1 wherein said instability is induced during said drawing said preform into said fiber.

3. The method of claim 1 wherein said instability is induced after said drawing said preform into said fiber by further including annealing said fiber.

4. The method of claim 1, further including consolidating said preform prior to said drawing said preform into said fiber.

5. The method of claim 1 wherein said host includes an electrically insulating material.

6. The method of claim 1 wherein said host includes a polymer.

7. The method of claim 1 wherein said host includes a plurality of nanotubes.

8. The method of claim 1 wherein said host includes a plurality of voids.

9. The method of claim 1 wherein said quantum dots includes a semiconductor.

10. The method of claim 1 wherein said quantum dots includes bismuth.

11. The method of claim 1 wherein said instability is a fluid dynamics instability.

12. The method of claim 1 wherein said instability is a Rayleigh instability.

13. The method of claim 1 wherein said fiber has an anisotropic thermal conductivity.

14. The method of claim 1 wherein said host includes a thermal insulating material.

15. The method of claim 8 wherein said voids encapsulate a gas.

* * * * *